(12) United States Patent
Chartier et al.

(10) Patent No.: US 6,546,075 B1
(45) Date of Patent: Apr. 8, 2003

(54) ENERGY SENSITIVE DETECTION SYSTEMS

(75) Inventors: Yves Chartier, Saint-Eustache (CA); Francois Lippens, Boisbriand (CA)

(73) Assignee: EPSIRAD Inc., St-Eustache (CA)

( * ) Notice: Subject to any disclaimer, the term of this patent is extended or adjusted under 35 U.S.C. 154(b) by 0 days.

(21) Appl. No.: 09/568,820

(22) Filed: May 10, 2000

Related U.S. Application Data

(60) Provisional application No. 60/133,362, filed on May 10, 1999, and provisional application No. 60/160,938, filed on Oct. 22, 1999.

(51) Int. Cl.[7] .............................................. H05G 1/64
(52) U.S. Cl. ...................... 378/98; 378/98.9; 258/370.9
(58) Field of Search ......................... 378/98, 98.8, 98.9, 378/19; 250/370.1, 370.09, 580

(56) References Cited

U.S. PATENT DOCUMENTS

| | | |
|---|---|---|
| 3,778,614 A | 12/1973 | Hounsfield |
| 3,848,130 A | 11/1974 | Macovski |
| 3,944,830 A | 3/1976 | Dissing |
| 3,996,471 A | 12/1976 | Fletcher et al. |
| 4,247,774 A | 1/1981 | Brooks |
| 4,511,799 A | 4/1985 | Bjorkholm |
| 4,789,930 A | 12/1988 | Sones et al. |
| 4,811,373 A | 3/1989 | Stein |
| 4,821,306 A | 4/1989 | Mulder |
| 4,937,453 A * | 6/1990 | Nelson ................ 250/370.09 |
| 5,056,125 A | 10/1991 | Beland |
| 5,150,394 A | 9/1992 | Karellas |
| 5,164,583 A | 11/1992 | Aichinger et al. |
| 5,166,961 A | 11/1992 | Brunnett et al. |
| 5,241,576 A | 8/1993 | Lonn |

(List continued on next page.)

FOREIGN PATENT DOCUMENTS

| | | |
|---|---|---|
| CA | 2228065 | 2/1997 |
| EP | 0 826 983 A1 | 3/1998 |
| EP | 0 971 244 A2 | 1/2000 |
| WO | WO 96/31976 | 10/1996 |
| WO | WO 97/05505 | 2/1997 |
| WO | WO 97/05654 | 2/1997 |
| WO | WO 97/05659 | 2/1997 |

OTHER PUBLICATIONS

K.S. Shah et al.; Characterization of X–Ray Imaging Properties of PbI2 Films.

R. Luhta et al.; Feasibility of a large area x–ray sensitive vidicon for medical fluoroscopy: Signal and noise factors; Med. Phys. 24 (5); May 1997; pp. 609–620.

R. Luhta et al.; Feasibility of a large area x–ray sensitive vidicon for medical fluoroscopy: Resolution and lag factors; Med. Phys. 24 (5); May 1997; pp. 621–631.

G. Pang et al.; Large area x–ray sensitive video camera: design of electron optics; SPIE, vol. 3032; 1997; pp. 82–87.

(List continued on next page.)

Primary Examiner—David P. Porta

(57) ABSTRACT

An X-ray detection system includes at least two electrodes constructed and cooperatively arranged at a photoconductive material to provide an electric field inside the material in a first direction, an X-ray shield and an X-ray window, a readout circuitry, and a processing circuitry. The X-ray shield and the X-ray window are constructed and arranged to direct X-rays into the photoconductive material in a selected X-ray direction substantially different from the first direction, wherein the directed X-rays are absorbed at a location inside the photoconductive material at a depth corresponding to their energy. The read-out circuitry is constructed and arranged to receive electric signals corresponding to the absorption location inside the photoconductive material. The processing circuitry is constructed and arranged to determine the energy of the absorbed X-rays based on the electric signals.

27 Claims, 19 Drawing Sheets

U.S. PATENT DOCUMENTS

| | | | |
|---|---|---|---|
| 5,291,402 A | | 3/1994 | Pfoh |
| 5,355,309 A | | 10/1994 | Eberhard et al. |
| 5,391,977 A | | 2/1995 | Beland |
| 5,396,072 A | | 3/1995 | Schiebel et al. |
| 5,420,905 A | | 5/1995 | Bertozzi |
| 5,430,784 A | | 7/1995 | Ribner et al. |
| 5,434,417 A | * | 7/1995 | Nygren .................. 250/370.09 |
| 5,490,218 A | | 2/1996 | Krug et al. |
| 5,498,880 A | | 3/1996 | Lee et al. |
| 5,524,133 A | | 6/1996 | Neale et al. |
| 5,548,123 A | | 8/1996 | Perez-Mendez et al. |
| 5,556,716 A | | 9/1996 | Herron et al. |
| 5,570,403 A | | 10/1996 | Yamazaki et al. |
| 5,729,021 A | | 3/1998 | Brauers et al. |
| 5,737,382 A | | 4/1998 | Stierstorfer |
| 5,790,021 A | | 8/1998 | Mickel et al. |
| 5,825,032 A | | 10/1998 | Nonaka et al. |
| 5,827,757 A | | 10/1998 | Robinson, Jr. et al. |
| 5,838,758 A | | 11/1998 | Krug et al. |
| 5,841,832 A | | 11/1998 | Mazess et al. |
| 5,844,243 A | | 12/1998 | Lee et al. |
| 5,867,554 A | | 2/1999 | Hupke |
| 5,869,837 A | | 2/1999 | Huang |
| 5,895,936 A | | 4/1999 | Lee |
| 5,917,210 A | | 6/1999 | Huang et al. |
| 5,930,591 A | | 7/1999 | Huang |
| 5,949,846 A | | 9/1999 | Stein et al. |
| 5,969,360 A | | 10/1999 | Lee |
| 6,025,599 A | | 2/2000 | Lee et al. |
| 6,052,433 A | | 4/2000 | Chao |

OTHER PUBLICATIONS

G. Pang et al.; Lens design for large–area x–ray sensitive vidicons; Med. Phys. 25 (8); Aug. 1998; pp. 1533–1546.

Wei Zhao et al; A large area solid–state detector for radiology using amorphous selenium; SPIE, vol. 1896; 1993; pp. 114–120.

W. Hillen et al.; Imaging performance of a selenium–based detector for high–resolution radiography; SPIE, vol. 1090; 1989; pp. 296–305.

David L. Ergun, PhD et al.; Single–Exposure Dual–Energy Computed Radiography: Improved Detection and Processing; Med. Phys. 174 (1); 1990; pp. 243–249.

Greg Freiherr; A Slice of the Future: CT Harnesses New Technologies; Medical Device & Diagnostic Industry; May 1999; pp. 80–87.

Precision switched integrator transimpedance amplifier; Burr–Brown Corporation IVC102; Jun. 1996; pp. 1–11.

* cited by examiner

ENERGY SENSITIVE DETECTION SYSTEMS

This application claims priority from U.S. patent application Ser. No. 60/133,362, filed on May 10, 1999 and U.S. patent application Ser. No. 60/160,938, filed on Oct. 22, 1999, both of which are incorporated by reference.

FIELD OF THE INVENTION

The present invention relates to novel X-ray or gamma-ray systems capable of detecting and resolving X-rays or gamma-rays of different energy levels.

BACKGROUND OF THE INVENTION

X-ray and gamma-ray systems have been widely used over the last several decades in the industry and in medicine. Conventional radiography systems include an X-ray source (or a gamma-ray source) for producing a beam of X-rays (or gamma-rays) transmitted through an object, and an X-ray detector (or a gamma-ray detector) for detecting the transmitted radiation on a film or electronically. Alternatively, an X-ray detector may be located relative to the X-ray source to detect scattered X-rays. Electronic X-ray detectors directly convert X-rays to electrical signals, or indirectly detect X-rays by first converting them to secondary optical radiation and then detecting the secondary optical radiation. The electrical signals are then digitized and processed. Digital radiography provides numerous advantages over conventional radiography. The digital data is immediately available and can be processed and enhanced depending on the information to be extrapolated. Furthermore, the digital data may provide quantitative attenuation of the object when the data is calibrated and interpreted in absolute units.

An X-ray source can emit a broad spectrum of X-rays generated by a high-energy electron beam striking a metallic target. X-rays emitted from such polychromatic source are collimated to form a stationary or scanning pencil beam, a fan beam, or a wide area beam. Alternatively, an X-ray source can emit X-rays having two or several energy bands, wherein each energy band of X-rays may be quite narrow and thus considered mono-energetic.

Attenuation of X-rays depends on the thickness of the examined object, its density and its components. Different elements exhibit different relative attenuation of X-rays depending on their atomic number (Z). In the range of about 30 keV to 150 keV, the X-ray attenuation is characterized by three effects: Compton scattering, photoelectric absorption, and coherent scattering. Each material can be identified (i.e., atomic number Z can be calculated) based on its X-ray attenuation arising from Compton scattering and photoelectric absorption. Specifically, Compton scattering is dominant for the low atomic number materials and relatively small for high atomic number materials. Photoelectric absorption is more prevalent for high atomic number materials. Therefore, some medical or industrial applications may need multiple X-ray energy data.

X-ray imaging has been widely used for industrial testing and detection. A conventional X-ray image records the transmission of an object to a broad spectrum of X-rays. An X-ray inspection device uses an X-ray source emitting X-rays collimated relative to an X-ray detector, and a processor for analyzing the detected data and creating an image. X-rays examine or scan an object by a relative movement of the X-ray beam and the object. An X-ray inspection device may use line scanning for inspecting moving objects. Such inspection device uses a conveyor for moving an object, an X-ray source emitting a fan beam of X-rays directed toward an X-ray line detector. An object, usually moving at a constant speed on a conveyor, crosses the fan beam and thus causes X-ray flux variation at the detector. The detector provides successive lines of X-ray data used to create an image.

X-ray imaging has also been widely used in medicine. X-ray based systems are widely used for imaging and for bone densitometry. A conventional X-ray system transmits a wide-area X-ray beam through a patient and the transmitted x-rays are detected by a film or by a detector plate to obtain an image (for example, a chest X-ray). Other medical systems may collimate the generated X-rays into a pencil beam or a fan beam to scan a patient. An X-ray bone densitometer can use a scanning pencil beam or a fan beam directed to a point detector or a linear array of detectors, respectively. The detected radiation depends on the bone density, which is measured to evaluate and/or monitor osteoporosis.

In a CT system a thin fan beam of X-rays is directed through a patient's body and detected by a line detector, usually including a line of individual sensors aligned along an arcuate or linear path. The examined patient is movably interposed between the source and the detector, which are always aligned with respect to the X-ray beam. For each position of the examined patient, the detector detects a fan beam of transmitted X-rays and produces a row of analog signals. The analog signals are digitized and provided to a processing unit that processes the data and provides an image to a display.

Dual energy radiography has been successfully used for medical applications and for detection and characterization of materials. A dual-energy X-ray system uses a single energy, a dual-energy or a multiple-energy X-ray source and at least two energy discriminant detectors. (Alternatively, a dual-energy X-ray system may use a source providing dual energy X-ray pulses and a single detector.) A first and a second energy detector may include a scintillating layer or material (e.g., a scintillating crystal) and optical detector (e.g., a photo diode or a phototransistor) located adjacent to the scintillating material. The two X-ray sensitive layers are aligned serially with respect to the direction of the X-rays. Low energy X-rays are more absorbed in the first sensitive area, while high energy X-rays are more absorbed in the subsequent X-ray sensitive layer. Thus, the first detector is frequently called a "thin" detector and the second detector is called a "thick" detector due to its ability to detect higher energy (harder) X-ray radiation. The individual detectors can be calibrated using two reference materials. The first reference material is usually a plastic such as Plexiglass™ and the second is aluminum. The detector detects high energy and low energy values for known material thickness. Only two basic materials are required to determine the thickness-signal relationship for any other material.

Dual-energy X-ray detectors detect separately X-rays penetrating to different depth ranges based on their energies. Such X-ray detector includes a first strip of crystalline amorphous silicon (or another X-ray sensitive material) having a first surface in which X-rays of a first energy are absorbed. The first surface is disposed substantially perpendicularly to the incident X-rays. A second strip of crystalline or amorphous silicon has a surface in which X-rays of a second energy are absorbed. The second surface is again disposed substantially perpendicularly to the incident X-rays. The X-ray detector may also include an absorber (for example, an X-ray absorbing foil) stacked upstream from the first detector surface. The two X-ray detectors are stacked perpendicularly relative to the direction of X-rays and detect discrete X-ray energies (or energy bands), but cannot detect a continuum of X-ray energies.

Recently, new types of X-ray detectors have been using wide-area X-ray sensitive layers for direct or indirect detection of X-rays. A typical detector may include a two-dimensional, X-ray sensitive area with a plurality of individual sensors oriented substantially perpendicularly to incoming X-rays. These sensors provide again analog signals that are digitized and provided to a processing unit. However, these X-ray detectors cannot discriminate a spectrum or a continuum of X-ray energies.

Two-dimensional X-ray detectors may in the future replace X-ray films. A two-dimensional X-ray detector includes a two-dimensional array of sensors connected to a switching and addressing circuitry. The individual sensors typically include a pair of generally co-planar conductive microplates separated by a dielectric layer forming a charge storage capacitor. A photoconductive layer extends over all the sensors above the microplates. The X-ray detector also includes a top electrode placed over the photoconductive layer. A charging voltage is applied between the bottom microplates of all sensors and the top electrode to create an electric field across the photoconductive layer. The detected X-ray radiation irradiates the area of X-ray sensitive layer, i.e., the two-dimensional array is oriented perpendicularly relative to the direction of the X-rays. The received X-rays create electron-hole pairs, which under the influence of the applied electric field migrate across the photoconductive layer. The migration results in the accumulation of charge on the charge storage capacitors formed by the two microplates. The amount of charge stored in the storage capacitors varies proportionally to the radiation exposure. The stored charge is read-out and processed to create an image.

In the above identified applications, there still is a need to detect different energy levels of X-rays (or gamma-rays). There is a need for reliable energy sensitive detection systems capable of detecting discrete or continuous energy levels of X-rays and gamma-rays.

SUMMARY OF THE INVENTION

The present invention is directed to novel X-ray and gamma-ray systems and methods for medical, industrial or other applications. These systems use energy sensitive X-ray (or gamma-ray) detection systems capable of detecting and resolving X-rays (or gamma-rays) of different energy levels. Furthermore, the X-ray (or gamma-ray) detection system can directly convert X-rays (or gamma-rays) to electrical signals. Alternatively, the present X-ray (or gamma-ray) detection system can use a scintillating material to convert X-rays (or gamma-rays) to optical radiation that is detected and converted to electrical signals. Importantly, the detection system can discriminate different X-ray (or gamma-ray) energy levels.

According to one aspect, an X-ray detection system includes a photoconductive material, at least two electrodes, an X-ray shield, and a read-out circuitry. The photoconductive material and the electrodes are co-operatively arranged to provide an electric field inside the material in a first (field) direction. The X-ray shield, constructed and arranged to absorb X-ray radiation, includes an X-ray window arranged to direct X-rays into the photoconductive material in a selected X-ray direction. The X-ray direction may be oriented at an angle in the range of about 5° to 90° relative to the field direction, and preferably in the range of about 45° to 90° relative to the field direction, and more preferably 90° relative to the field direction. The read-out circuitry is arranged to receive electric signals corresponding to the absorption of X-ray radiation at different depths in the photoconductive material.

According to another aspect, an X-ray detection system includes at least two electrodes constructed and cooperatively arranged at a photoconductive material to provide an electric field inside the material in a first direction, an X-ray shield and an X-ray window, a read-out circuitry, and a processing circuitry. The X-ray shield and the X-ray window are constructed and arranged to direct X-rays into the photoconductive material in a selected X-ray direction substantially different from the first direction, wherein the directed X-rays are absorbed at a location inside the photoconductive material at a depth corresponding to their energy. The read-out circuitry is constructed and arranged to receive electric signals corresponding to the absorption location inside the photoconductive material. The processing circuitry is constructed and arranged to determine the energy of the absorbed X-rays based on the electric signals.

According to yet another aspect, an X-ray system includes an X-ray source and an X-ray detection system. The X-ray source is constructed and arranged to emit X-rays having at least two different energies. The X-ray detection system includes at least two electrodes constructed and cooperatively arranged at a photoconductive material to provide an electric field inside the material in a first direction, an X-ray shield and an X-ray window, a read-out circuitry, and a processing circuitry. The X-ray shield and the X-ray window are constructed and arranged to direct X-rays into the photoconductive material in a selected X-ray direction substantially different from the first direction, wherein the directed X-rays are absorbed at a location inside the photoconductive material at a depth corresponding to their energy. The read-out circuitry is constructed and arranged to receive electric signals corresponding to the absorption location inside the photoconductive material. The processing circuitry is constructed and arranged to determine the energy of the absorbed X-rays based on the electric signals.

Preferred embodiments of these aspects include one or more of the following features:

At least one of the electrodes belongs to electron optics constructed and arranged to deflect an electron beam over a surface of the photoconductive material. The electron optics is co-operatively operates with the read-out circuitry to register the depth of the location when providing the electric signals. The read-out circuitry is arranged to integrate the excited charges over time.

The electrodes are arranged to apply a voltage directly to the photoconductive material to create the electric field inside the photoconductive material in the first direction. The electrodes include a first high-voltage electrode disposed on a first side of the photoconductive material and an array of electrodes distributed over a second side of the photoconductive material. The read-out circuitry is connectable to each electrode of the electrode array. The read-out circuitry is connectable to each the electrode of the array and is arranged to integrate the excited charges over time.

The photoconductive material is a film of a selected thickness or a plate. The photoconductive material is a film of a selected thickness; the electrodes are arranged to apply a voltage directly to the photoconductive material across the thickness to create the electric field inside the photoconductive material in the first direction; and the X-ray shield and the X-ray window are arranged to direct the X-rays to an edge of the film. The X-ray shield and the X-ray window are arranged to direct the X-rays to the edge having the X-ray direction being substantially perpendicular to the first direction. Alternatively, the X-ray shield and the X-ray window are arranged to direct the X-rays into the film, wherein the selected X-ray direction is oriented at an angle of about 45° to 90° relative to the first direction.

According to another aspect, a method of detecting X-ray radiation includes providing a photoconductive material cooperatively arranged with at least two electrodes, providing an electric field inside the photoconductive in a first direction, and shielding X-ray radiation for directing X-rays into the photoconductive material in a selected X-ray direction substantially different from the first direction. The directed X-rays are absorbed at a location inside the photoconductive material having a depth corresponding to their energy. The method further includes detecting charges excited at the absorption location inside the photoconductive material, and reading out electric signal corresponding to the excited charges.

According to yet another aspect, an X-ray sensitive apparatus includes a photo-conductive plate having a generally planar surface and being disposed inside of a scanning housing that also provides shielding. An electron beam scans the surface of the photo-conductive plate within the housing that includes a X-ray window for receiving of X-rays emitted from an external X-ray source. The housing and the X-ray window are arranged to collimate X-rays as to contact the photo-conductive plate at a selected acute or obtuse angle to the scanned surface.

Preferably, the external X-rays enter the housing through the window oriented perpendicularly to a side surface of the photo-conductive plate and in parallel to the scanned surface. The apparatus further includes an image processor constructed and arranged to receive a current generated in the photo-conductive plate due to the absorption of X-rays at different depths of the photo-conductive plate. The apparatus further includes a processor using an algorithm for generating color data or pseudo color data from current signals corresponding to the absorption of X-rays at different depths.

According to yet another aspect, an apparatus for sensing X-rays includes a photoconductive plate having a depth selected to receive, from an external X-ray source, X-rays having a selected distribution of energies which penetrate the photoconductive plate along its depth. The plate includes an array of electrodes arranged along the depth of the photoconductive plate in a pattern selected to sense an electrical signal created by the absorption of X-rays within the photoconductive plate.

DETAIL DESCRIPTION OF THE PREFERRED EMBODIMENTS

The present disclosure is directed to novel X-ray and gamma-ray systems for medical, industrial or other applications. These systems use energy sensitive X-ray and gamma-ray detection systems capable of detecting and resolving X-rays and gamma-rays of different energy levels. Furthermore, the X-ray or gamma-ray detection systems can directly convert X-rays or gamma-rays to electrical signals. Alternatively, the present X-ray or gamma-ray detection systems can use a scintillating material to convert X-rays or gamma-rays to optical radiation that is detected and converted to electrical signals. The present invention is illustrated by X-ray systems 10 and 12, shown in FIGS. 1 and 4, respectively; however, it is also applicable to similar gamma-ray systems.

Figure 1:
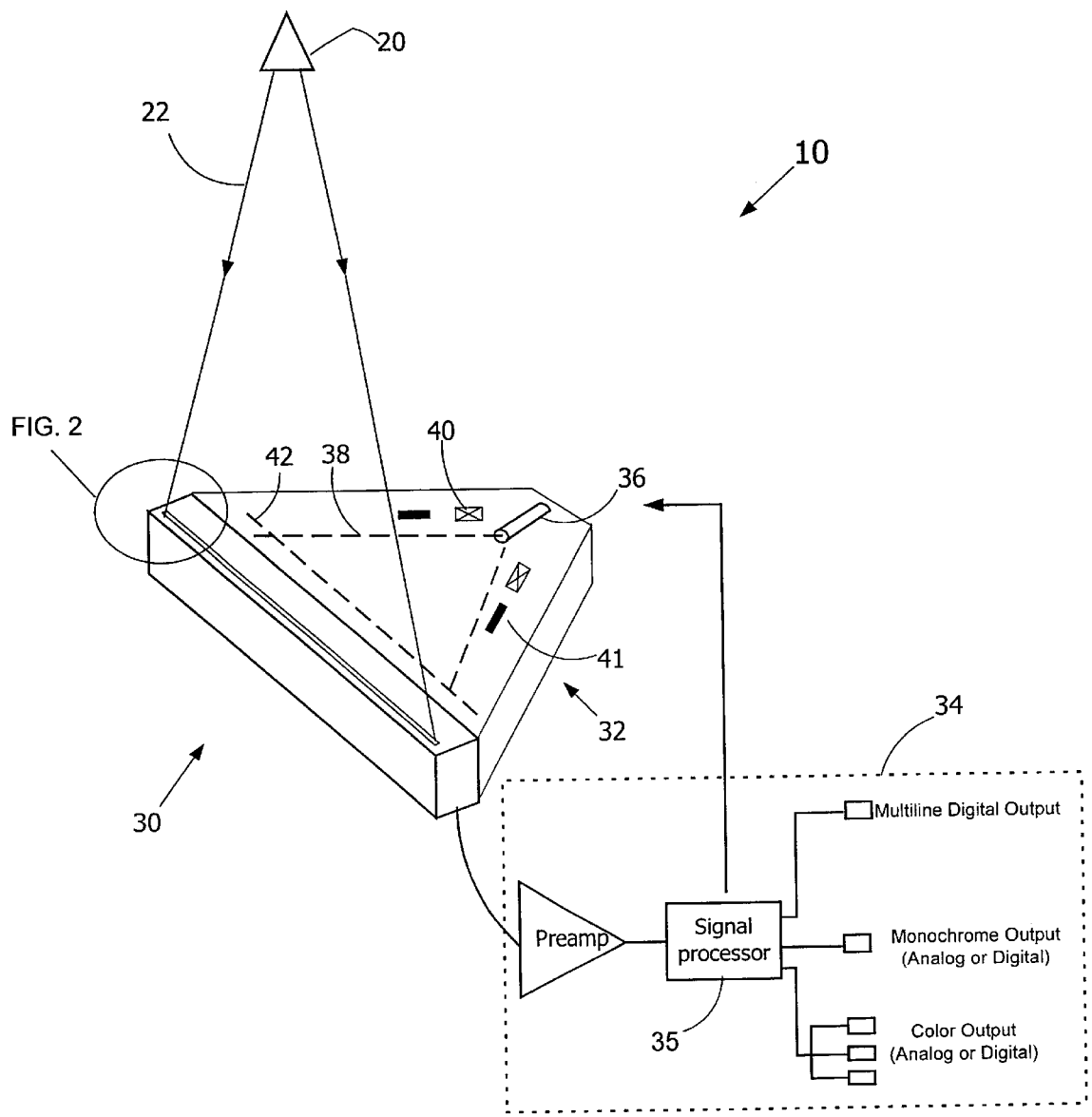
FIG. 1 shows schematically an X-ray system including an X-ray source and an X-ray detection system.

Referring to FIG. 1, an X-ray system 10 includes an X-ray source 20 and an X-ray detection system 30. X-ray source 20 may be constructed to emit a broad spectrum of X-rays generated by a high-energy electron beam striking a metallic target. X-rays emitted from such polychromatic source are collimated to form a stationary or scanning pencil beam, a fan beam, or a wide beam. Alternatively, X-ray source 20 may be constructed and arranged to emit X-rays of one or several energy bands (wherein each band of X-rays may be quite narrow to be considered mono-energetic). A suitable X-ray source is disclosed in U.S. Pat. No. 5,838,758, which is incorporated by reference. X-rays emitted from source 20 are collimated to form a pencil beam, a fan beam, or a wide-area beam and are directed toward a detection region of X-ray detection system 30. Other suitable X-ray sources are disclosed in U.S. Pat. Nos. 5,391,977 and 5,056,125, which are incorporated by reference.

Figure 2:
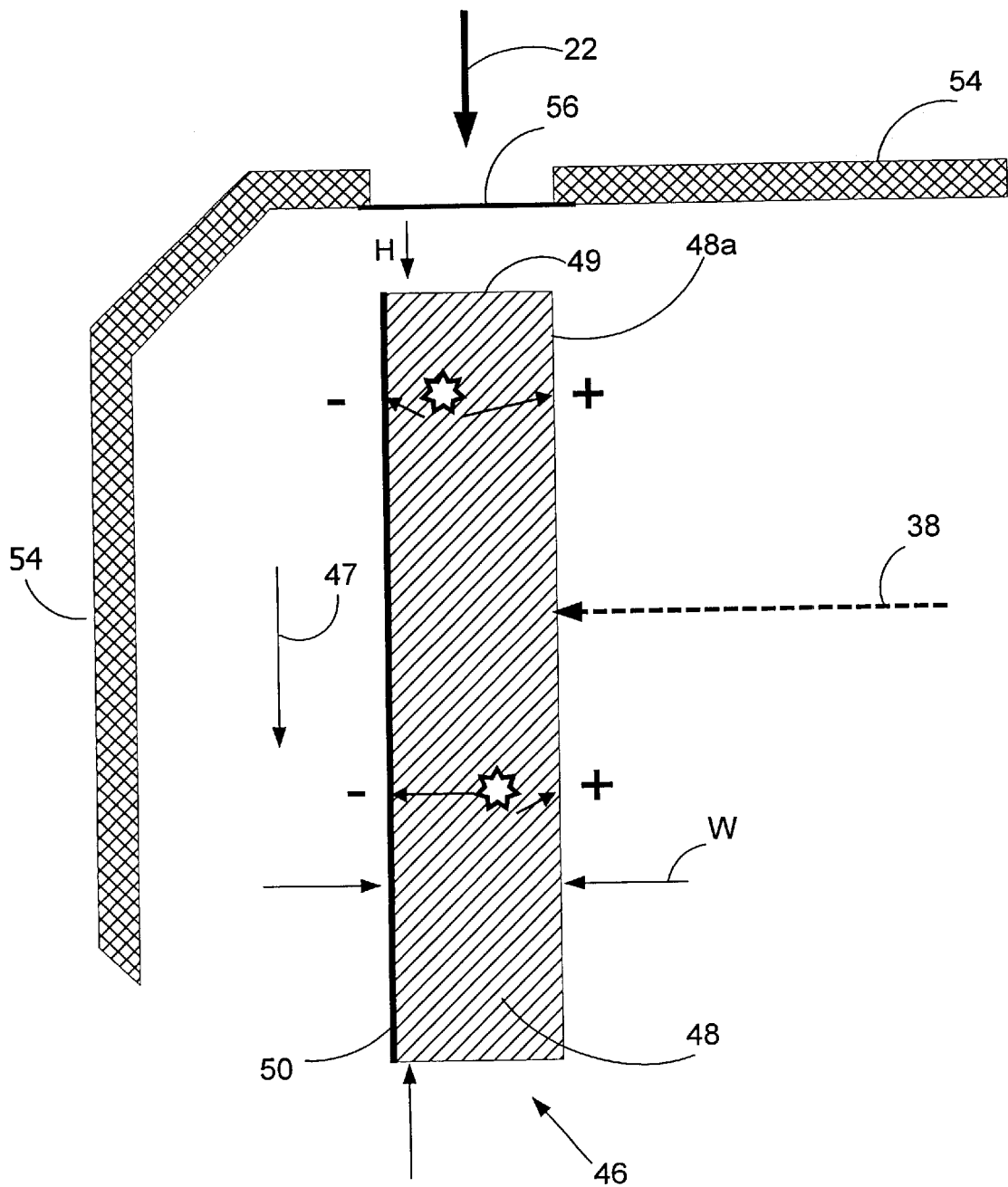
FIG. 2 shows a partial cross sectional view of an X-ray detector used in the X-ray detection system of FIG. 1.

Referring to FIGS. 1 and 2, X-ray detection system 30 includes an X-ray detector 32, which is a high-vacuum e-beam scanning device connected to and controlled by an electronic system 34. X-ray detector 32 includes an electron gun 36 constructed and arranged to emit an electron beam 38 directed toward a detector plate 46. FIG. 2 shows a cross-section of detector plate 46, which includes a photo-conductive material 48 and an electrode 50. Electrode 50 is connected to electronic processing system 34. Detector plate 46 is used for direct conversion of X-rays to electrical signals. (In the drawings, detector plate 46 and the individual elements are drawn only schematically without showing their relative sizes.)

X-ray detector 32 also includes an electron deflection system 40, at least one electrostatic lens 41 (usually two or three cylindrical coaxial lenses or electromagnetic deflection), and at least one field mesh electrode 42. Electron deflection system 40 and electrostatic lens 41 are located inside or outside of the housing. Deflection system 40 continually scans electron beam 38 over a target area, and lens system 41 creates a force acting on the electrons to alter their trajectory. Electrostatic lens 41 changes the incident angle of the beam relative to a surface 48a of photoconductive material 48. Field mesh electrode 42 decelerates electrons and thus reduces the kinetic energy of the electrons before they reach surface 48a. Optimally, the individual electrons of electron beam 38 land perpendicularly onto surface 48a of plate 46 and have very small kinetic energy. Furthermore, electrostatic lens 41 and field mesh 42 maintain a relatively small cross-sectional area of electron beam 38. X-ray detector 32 may also include a correction ring for correcting spherical aberration. The entire system is described in detail by G. Pang et al. in Lens Design for a Large Area X-ray Sensitive Vidicons, published in Medical Physics, Vol. 25, No. 8, August 1998, pp. 1533, which is incorporated by reference.

Referring to FIG. 2, the entire X-ray detector 32 includes an X-ray shield housing 54 (opaque to light) and a window 56, which is aligned for X-ray beam 22 to irradiate a detection edge 49 of photo-conductive material 48. X-ray shield housing 54 collimates X-ray beam 22 toward photoconductive material 48 in the direction of arrow 47. X-ray shield housing 54 also shields electronic and other elements inside X-ray detector 32. X-rays of different energies enter photo-conductive material 48 at the material edge 49 and travel generally in the direction of arrow 47. The penetration depth of the photons depends on the energy of X-rays (or gamma-rays) hitting detection edge 49. Photons of high-energy X-rays penetrate deeper inside photoconductive material 48 from detection edge 49 (in the direction of arrow 47) and, as they are extinguished, they generate an electron-hole pair. The scanning electron beam 38 "registers" the electron-hole excitation points and electronic system 34 receives the corresponding signal.

Photo-conductive material 48 may be a layer of amorphous selenium of about 500 $\mu$m deposited onto conductive plate (electrode) 50, e.g., Al, Cu, Ag or another material. Different photo-conductive materials are discussed below. In general, the photo-conductive material may be a thin or thick film, a plate, a volume of gel, or a volume of liquid surrounded by a barrier. Furthermore, the photo-conductive material may have a varying composition or density in the direction of arrow 47 to achieve a selected "absorption profile" of X-rays having a selected range of energies. Alternatively, the photo-conductive material may have discrete layers of materials distributed in the direction of arrow 47.

Detector plate 46 enables direct conversion of X-rays to electrical signals. Electrode 50 and electron beam 38 create an electric field across photo-conductive material 48. The electric field in the range 2 V/$\mu$m to 20 V/$\mu$m, and preferably about 10 V/$\mu$m. As electron beam 38 scans surface 48a of photo-conductive material 48 and as X-ray radiation 22 is absorbed inside photoconductive material 48, electron-hole pairs are formed inside photoconductive material 48. The generated holes move toward surface 48a as they are attracted by the impinging electrons and are neutralized. The generated electrons move toward electrode 50, which is connected to electronic system 34.

Referring again to FIG. 1, electronic processing system 34 includes a preamplifier and a signal processor 35 constructed and arranged to control electron deflection system 40 and provide digital or analog output data. The signal processor controls the scanning patterns as described in connection with FIGS. 3A through 3E. As X-ray radiation 22 is absorbed inside photoconductive material 48, the generated electrons create a charge on electrode 50 and are "read-out" in real time by electronic processing system 34. The scanning pattern together with the read-out provide an image of the X-ray energy spectrum since the penetration depth of the photons depends on the energy.

Detector plate 46 achieves a relatively high stability using, for example, a low secondary emission coating deposited on the surface of photoconductive material 48. The system is also arranged to eliminate excessive dark current arising when photoconductive material 48 is charged negatively by electron beam 38. The operation of this system is further described by R Lutha et al. in Feasibility of a Large Area X-ray Sensitive Vidicons for Medical Fluoroscopy: Signal to Noise Factors, published in Medical Physics, Vol. 24, No. 5, May 1997, pp. 609, which is incorporated by reference. Importantly, photoconductive material 48 has scanning surface 48a, which is usually smaller than the scanning surface in a Vidicon camera described in the above publications. The smaller surface provides a smaller tube capacitance $C_T$, which improves the performance. Furthermore, X-ray detector 32 can use a larger spot size of electron beam 38 to increase the signal to noise ratio.

Figure 3A:
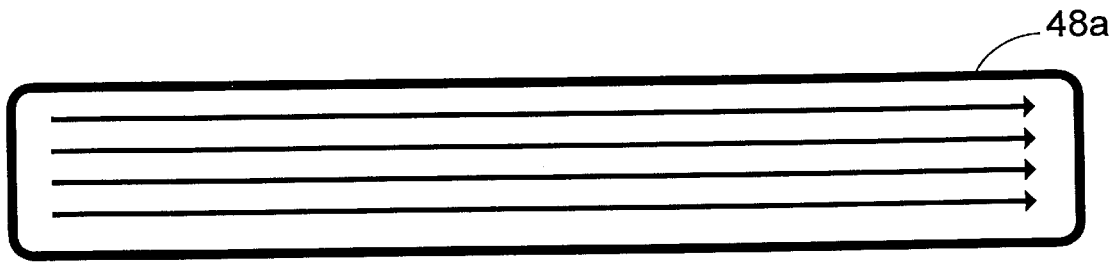
FIGS. 3A through 3E show different raster scanning patterns used in the X-ray detection system of FIG. 1.
Figure 3B:
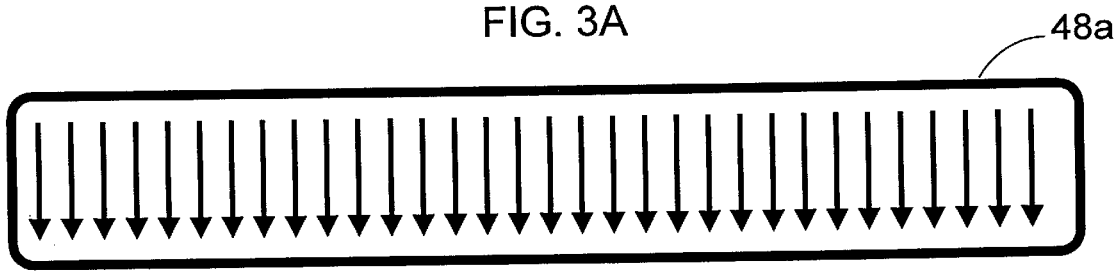
Figure 3C:
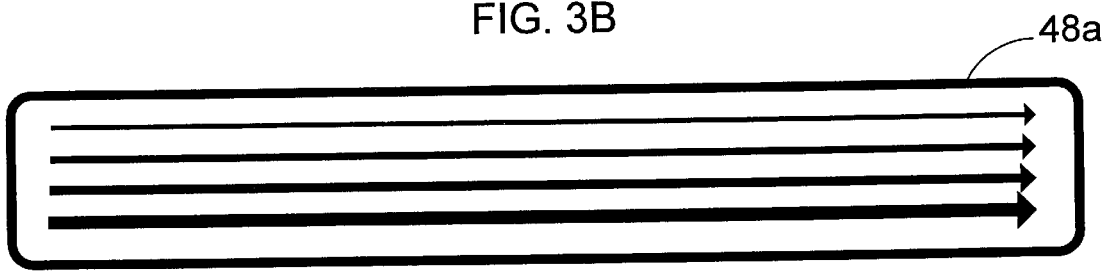
Figure 3D:
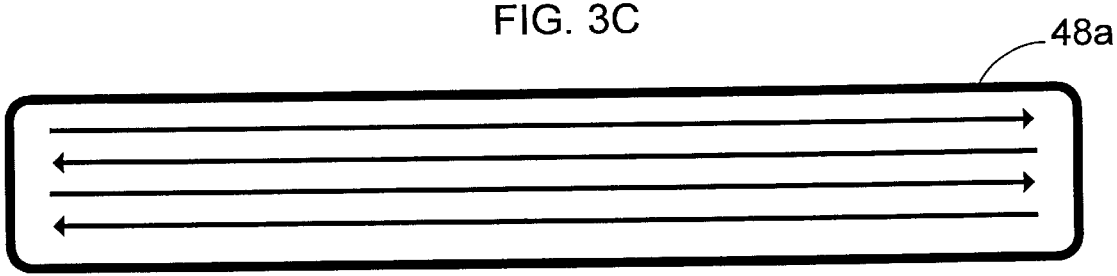
Figure 3E:
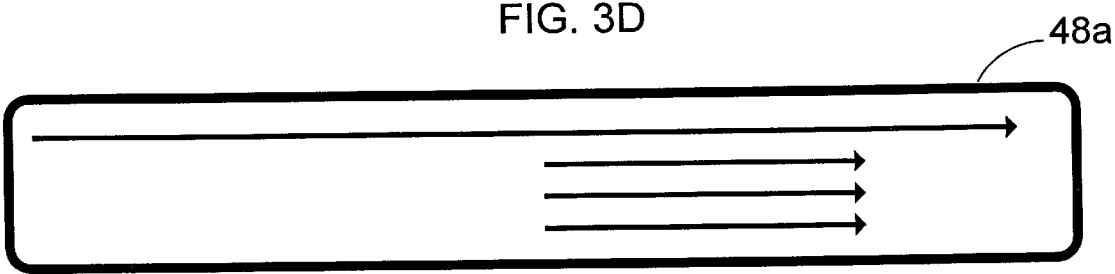

FIGS. 3A through 3E show different raster scanning patterns used for energy sensitive X-ray detection. Referring to FIG. 3A, the signal processor directs the standard sawtooth horizontal scanning as in video cameras and video monitors. Each line corresponds to a different X-ray penetration level. Alternatively, a vertical scanning pattern, shown in FIG. 3B, allows for the integration of the entire deposited energy signal, along the individual deposition paths. The scanning pattern shown in FIG. 3C is similar to the scanning pattern shown in FIG. 3A, but it compensates for energy deposition at deeper levels by increasing the focal spot size. This scanning pattern is useful since the X-rays are attenuated exponentially ($I=I_0 \exp-\mu d$) as they penetrate photoconductive material 48 from the edge 49. This scanning pattern can reduce the noise contribution of the deeper row in the output signal. Alternatively, the signal processor directs a bi-directional scan, shown in FIG. 3D, to reduce the sync overhead. The scanning pattern shown in FIG. 3E gives an example of a first scan line done to determine a region of interest, followed by succeeding passes to analyze this region in greater detail.

Figure 3F:
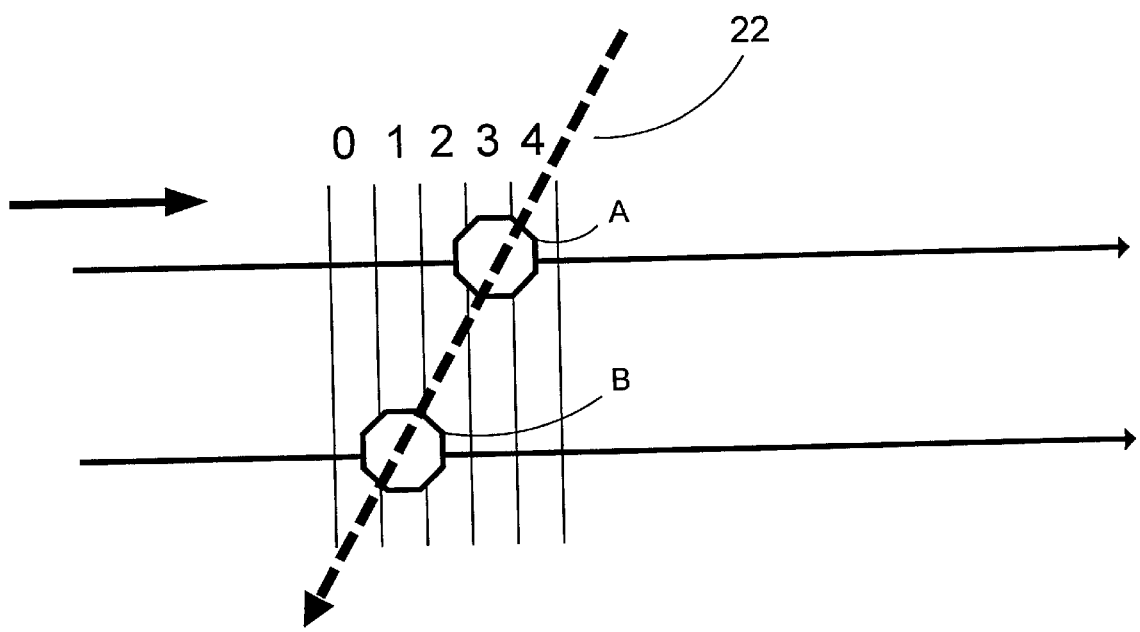
FIG. 3F shows schematically geometric correction performed to account for divergent propagation of the x-rays inside the X-ray detector of FIG. 2.

Referring to FIG. 3F, the signal processor can correct for divergent propagation of X-rays inside photoconductive material 48. FIG. 3F shows two horizontal scan lines and the generation of two electron-hole pairs due to X-ray absorption of X-rays 22. The angle at which the detected X-rays reach photoconductive material 48 causes a loss of resolution proportional to the plate height. As shown in FIG. 3F, X-ray beam 22 excites the first electron-hole pair in location A, during a time interval 3, and the second electron-hole pair in location B, during a time interval 1. This effect is compensated for by dynamically adjusting the sampling period (see time intervals 0, 1, . . . 4) during the analog to digital conversion for the individual scan lines. Alternatively, this correction is performed by digital re-sampling.

Referring again to FIG. 1, signal processor 35 of electronic processing system 34 fully controls the above scanning patterns. Signal processor 35 provides an output for the color emulation mode (pseudo-color), which corresponds to a scaled frequency translation from the detected penetration level bands. Signal processor 35 sorts the horizontal scanned lines according to their respective penetration levels an then scales them and adds the data into, for example, three line bins. Signal processor 35 outputs the three lines that may be assigned colors corresponding to penetration energy bands and thus X-ray energy bands. A display displays a multiple penetration x-ray image in pseudo-colors. The energy output may by compatible with the standards already in use for visible cameras so that the existing color image processing software can be used.

Figure 4:
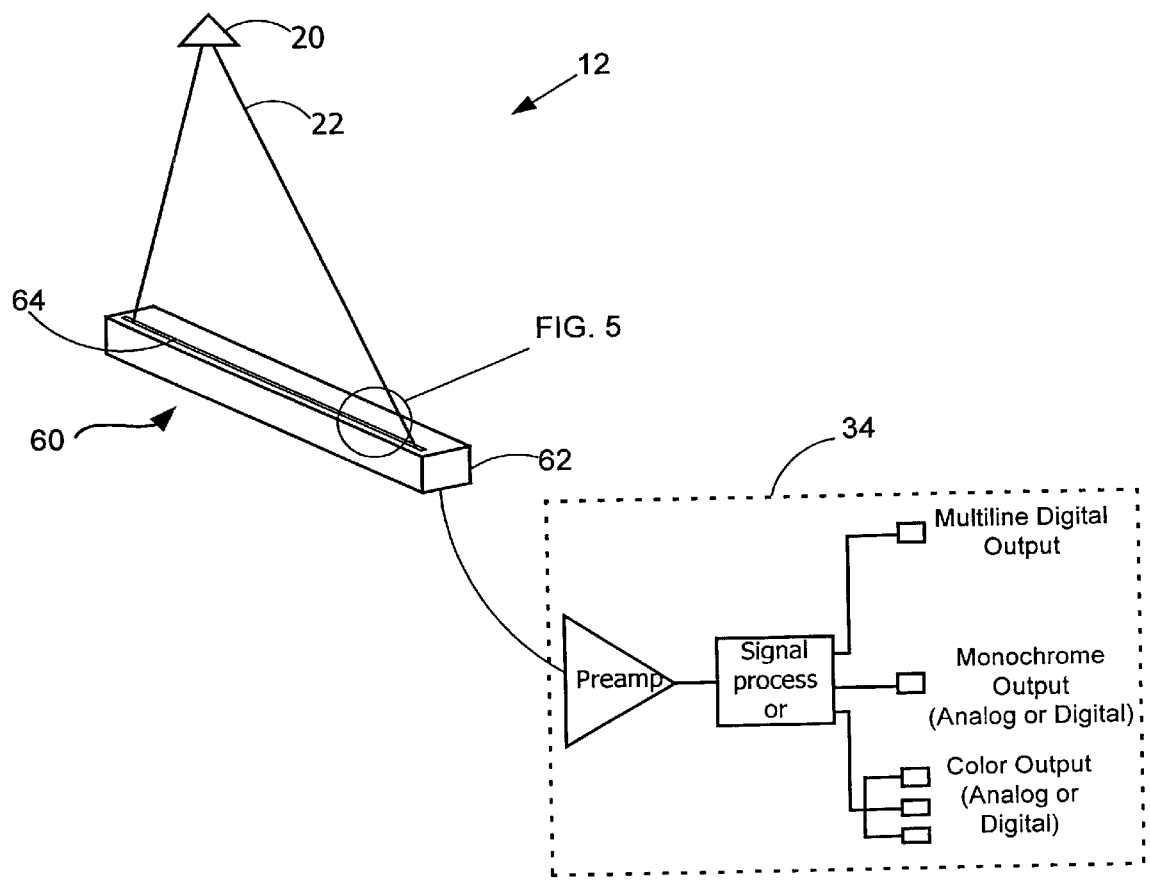
FIG. 4 shows schematically an X-ray system including an X-ray source and an X-ray detection system.
Figure 5:
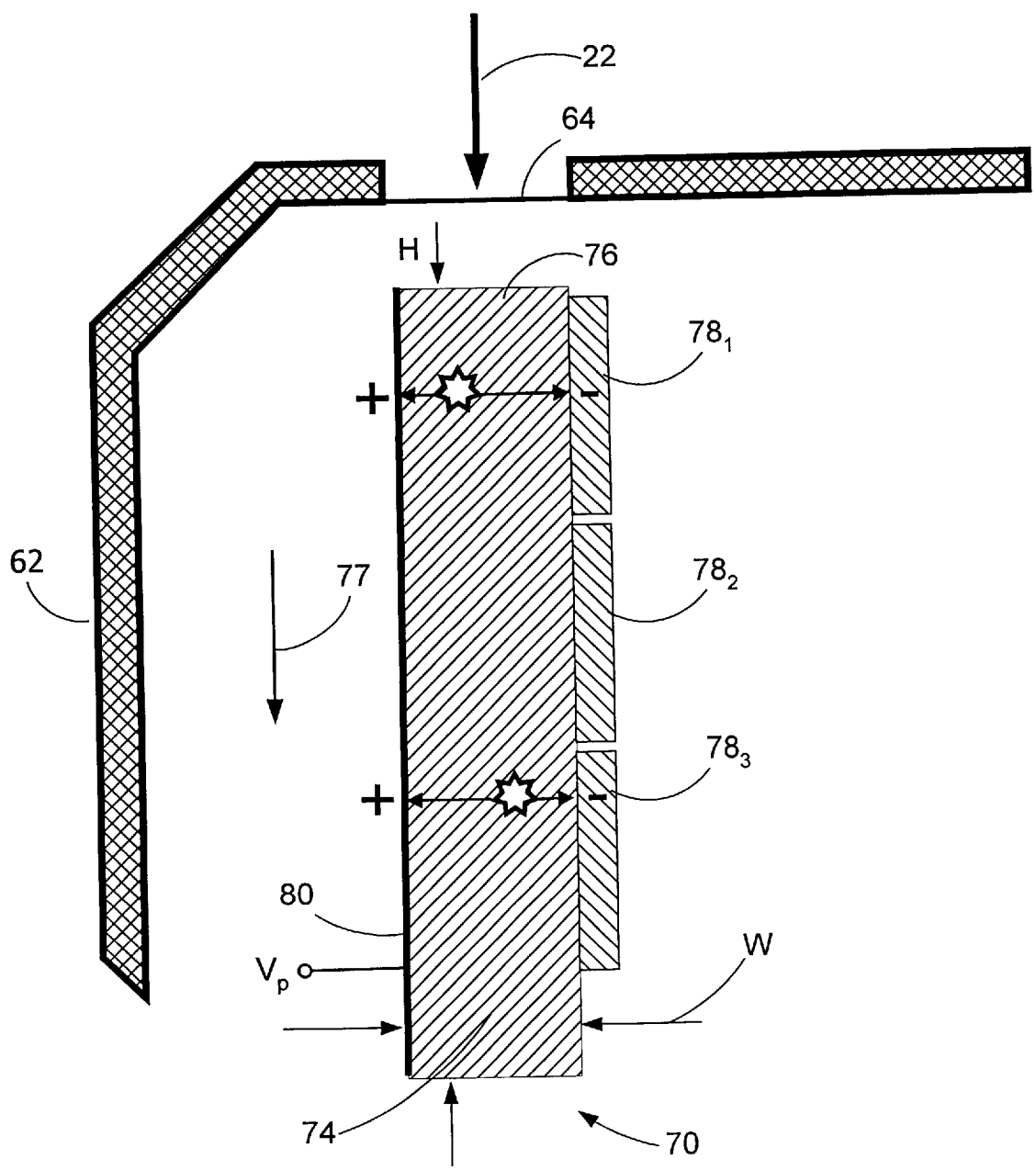
FIG. 5 is a partial cross sectional view of an X-ray detector shown in FIG. 4.

Referring to FIGS. 4 and 5, X-ray system 12 includes source 20 emitting X-ray radiation 22 directed toward an X-ray detection system 60. X-ray detection system 60 includes a detector housing 62, which surrounds a detector plate 70 (shown in FIG. 5) connected to electronic processing system 34. Detector plate 70 includes a photoconductive material 74, an array of electrodes $78_1$, $78_2$, ... $78_N$, selectively arranged for optimal detection of X-rays of different energies, and a high-voltage electrode 80. Detector housing 62 selectively shields from X-rays detector plate 70 and other electronic elements located inside X-ray detection system 60. Typically, the width W of photoconductive material 74 is about 0.5 mm, the height H is about 5 mm to 50 mm, and the length about 20 mm to 200 mm.

X-ray detection system 60 includes an X-ray window 64 (or a gamma-ray window) aligned with an edge 76 of detector plate 70 so that the detected X-ray radiation is directed into photoconductive material 74 in the direction of arrow 77. High-voltage electrode 80 and electrodes $78_1$, $78_2$, ... $78_n$ create an electric field across photoconductive material 74. The electric field is about 10 V/µm, and is in the direction substantially perpendicular to the direction of arrow 77. (In general, the direction of incoming photons does not have to be perpendicular to the direction of the electric field.)

Detector plate 70 enables direct conversion of X-rays into electrical signals. As X-ray radiation 22 is absorbed inside photoconductive material 74 and highvoltage electrode 80 and electrodes $78_1$, $78_2$, ... $78_n$ create the electric field across, photons of the detected X-rays travel over an absorption trajectory and excite electron-hole pairs inside photoconductive material 74. The generated holes move toward electrode 80. The generated electrons move toward electrodes $78_1$, $78_2$, ... $78_n$, which are individually connected to an electronic system such as system 34 or other systems described below. In general, the polarity of high-voltage electrode 80 and electrodes $78_1$, $78_2$, ... $78_n$ may be reversed depending on photoconductive material 74, which may include several stacked layers, as described below, and depending on the read-out circuitry. For example, detector plate 70 may use positively biased high-voltage electrode 80, made of aluminum as used in the thin film transistor (TFT) panels.

Figure 6:
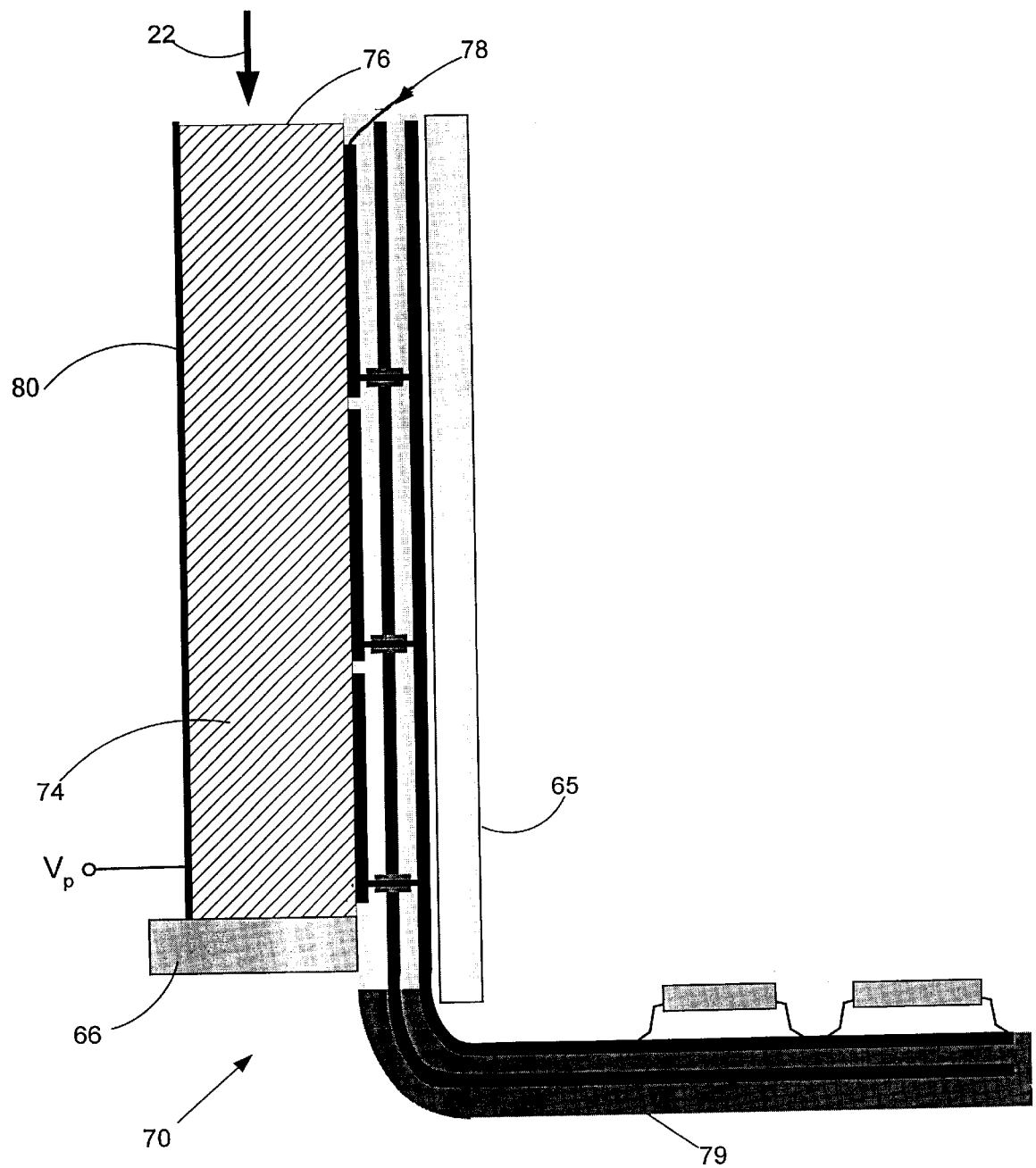
FIGS. 6, 6A and 6B are cross sectional views of detector plates used in the X-ray detection system of FIG. 4.
Figure 6A:
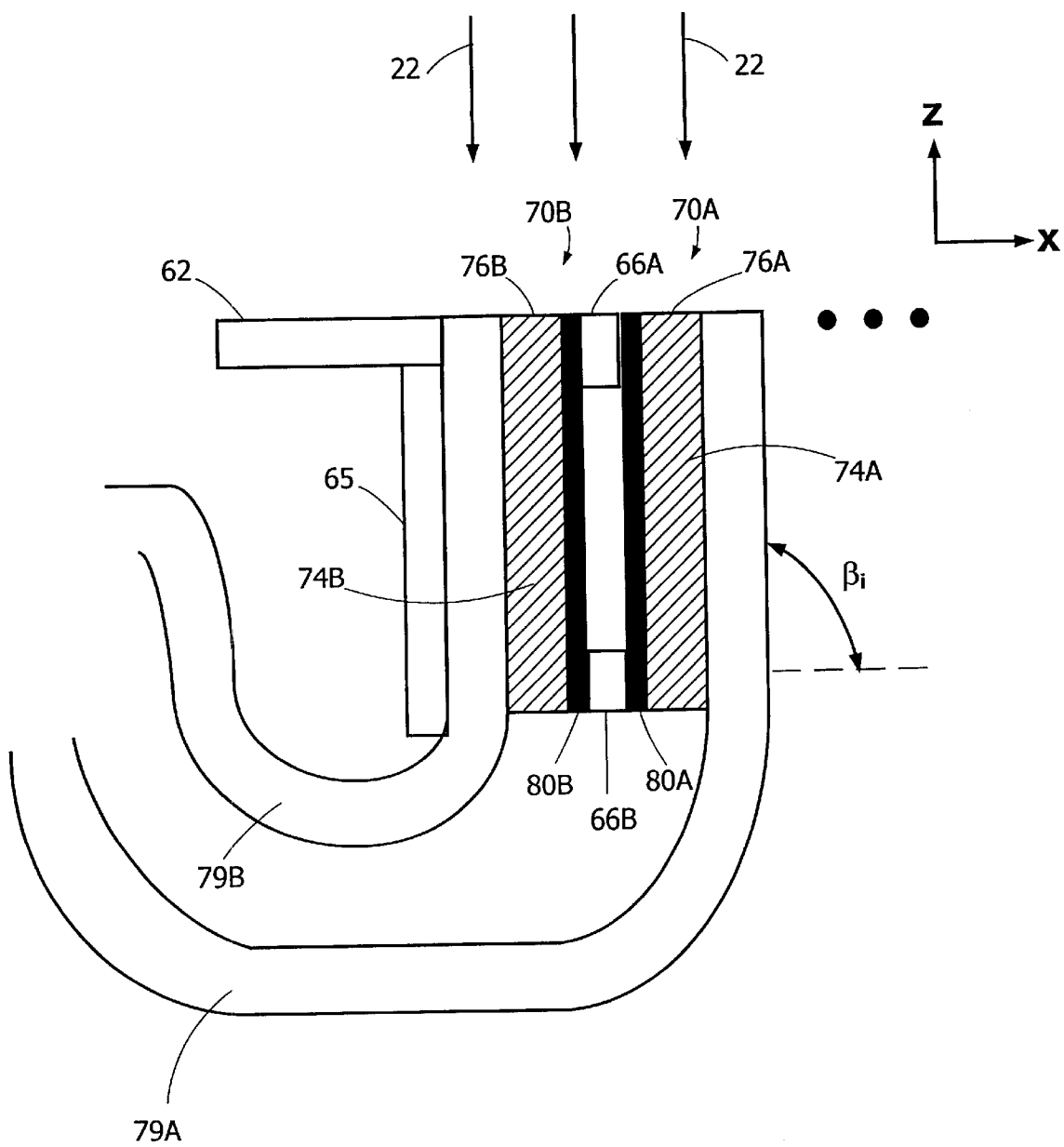
Figure 6B:
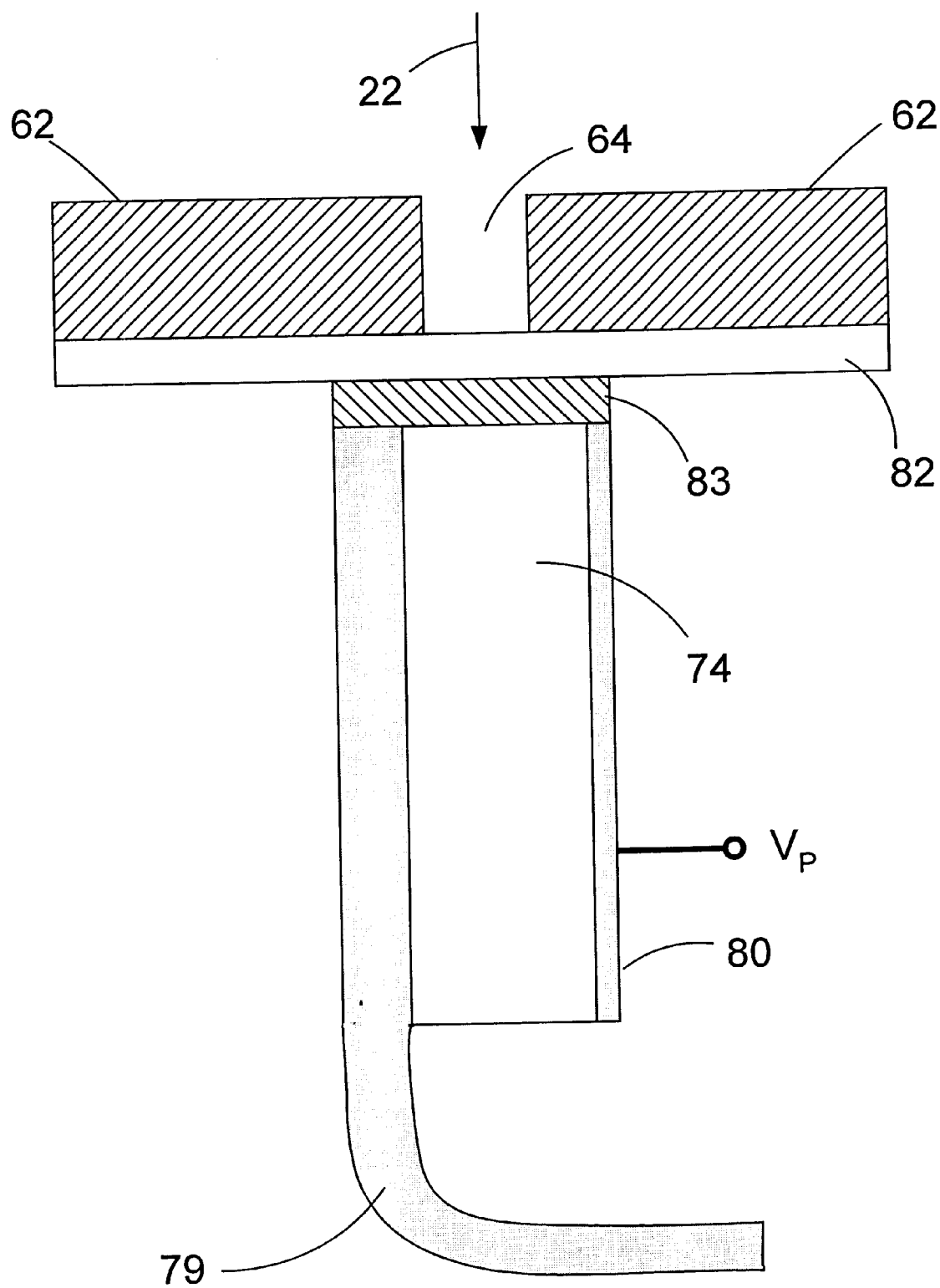

FIG. 6 shows detector plate 70 used in the X-ray detection system of FIG. 4. Detector plate 70 includes photoconductive material 74, high-voltage electrode 80, and an array of electrodes 78 located on a printed circuit board 79. There may be a blocking layer between photoconductive material 74 and each electrode 78. Printed circuit board 79 may be a flexible printed circuit board (as shown in FIGS. 6, 6A and 6B) or a standard printed circuit board. The electrode array 78 includes a number of small conductive plates located in contact with the surface of photoconductive material 74 for collecting the charges.

Printed circuit board (PCB) 79 includes the array of electrodes 78 and amplifier electronics described in connection with FIG. 9. An insulating PCB plane may also be used to reduce electrical and electromagnetic interference. Detector plate 70 may also include radiopaque material sheets 65 and 66, which reduce or eliminate X-rays re-emitted or transmitted by photoconductive material 74 before reaching any radiation sensitive components of detector 60. The sensitive edge 76 of photoconductive material 74 is cut and polished without significantly heating the material. Since photoconductive material 74 is located along with the PCB substrate like a sandwich, special cleaning techniques are used to remove various impurities that could cause high voltage breakdown.

FIG. 6A is a cross sectional view of a dual plate assembly including two detector plates 70A and 70B used in the X-ray detection system of FIG. 4. Detector plates 70A and 70B have a similar design as detector plate 70, and can be used for computed tomography or another application that uses several detector plates. This configuration has several advantages. For example, five dual plate assemblies (including detector plates 70A and 70B) can be stacked together to obtain a 10 plate configuration. The dual plate assembly has a large fill factor of detector plates. Detector plates 70A and 70B are arranged symmetrically with respect to the high voltage (Vp) needed to operate them in the photoconductive mode. Housing 62 and radiopaque material sheet 65 shield and protect the readout circuitry. A lower spacing insert 66B and an upper spacing insert 66A provide shielding and alignment of sensitive edges 76A and 76B of respective photoconductive plates 74A and 74B. Lower spacing insert 66B and upper spacing insert 66A are very thin to obtain a large fill factor and may have a wedge shape to align photoconductive plates 74A and 74B at a relative angle. The angle $\beta i$ is adjusted during a calibration procedure (described below) for the entire assembly.

FIG. 6B shows another embodiment of detector plate 70 using a cross sectional view. As described above, detector plate 70 includes photoconductive material 74, high-voltage electrode 80, and printed circuit board 79 with electrodes $78_{ij}$ (not shown in FIG. 6B). Detector plate 70 (not drawn to the right scale) also includes a dielectric coating 83 (which is somewhat larger than plate 70) located below a high-voltage insulating sheet 82. High-voltage electrode is typically kept at Vp=5,000 Volts. To avoid high voltage breakdown, detector plate 70 uses dielectric coating 83, such as Parylene, capable of withstanding high voltage stresses. An optional thin P layer may be added over coating 83 to increase the absorption efficiency. Furthermore, housing 62 is separated from detector plate 70 by an insulating sheet 82, such as a thin sheet of polypropylene that isolates the detector voltage from the metal parts, e.g. housing 62, kept at ground potential.

As shown in FIGS. 7A through 7D, electrodes $78_{ij}$ are selectively arranged for optimal detection of X-rays having a different geometry and different X-ray energies. The space between the individual electrodes is minimized. The electrodes are formed on the standard or flexible PCB.

Figure 7A:
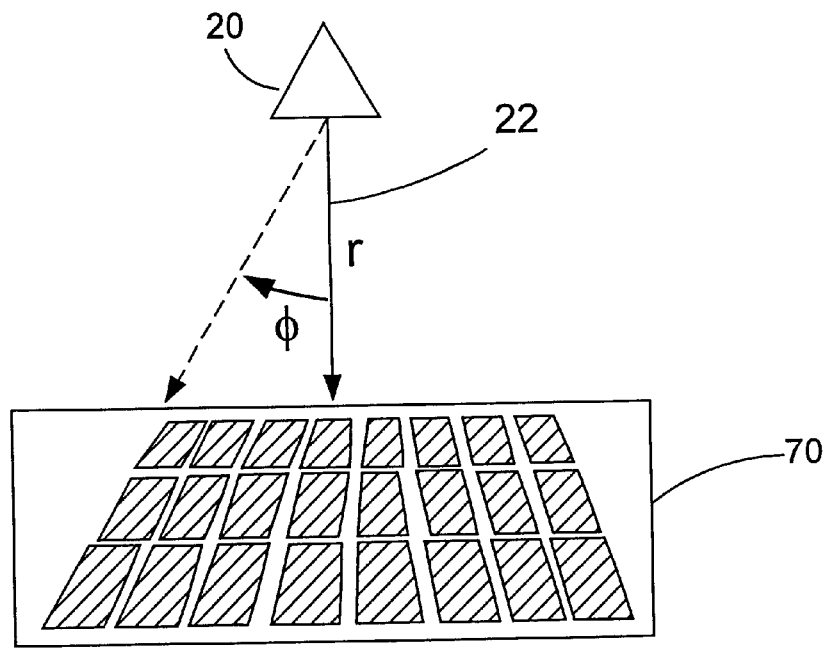
FIGS. 7A–7D show various arrangements of an electrode array used in the detector plate shown in FIG. 6.
Figure 7B:
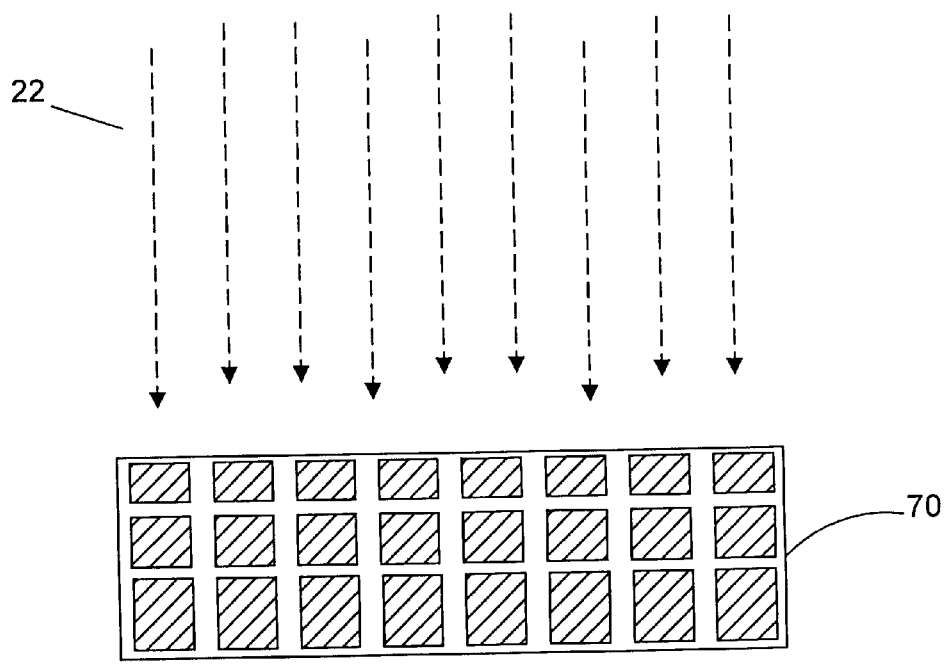

FIGS. 7A and 7B show two arrangements of electrodes designed to discriminate incident x-ray energies, as the electrodes attract electrons from the generated electron-hole pairs. As mentioned above, the top row of electrodes collects electrons produced mainly by the absorption of low energy x-rays. The bottom row of electrodes collects electrons produced only by absorption at deep penetration events. Since photoconductive material 74 is a good x-ray absorbent, this electrode arrangement allows to discriminate incident x-ray energies. As the number of rows is increased for a given electrode size, the penetration resolution (energy resolution) improves at the expense of an increased quantum noise. The optimal number of rows dependents upon X-ray energy ranges to be detected, the application of the X-ray detection system and the X-ray source and detector configuration.

Referring still to FIGS. 7A and 7B, the shape of the electrodes is designed relative to the incident angle of X-ray beam 22. That is, some or all of the electrode edges are aligned with the x-ray orientation. This type of "detector focusing" avoids degradation of the spatial resolution due to a relatively long absorption path inside photoconductive material 74. The electrode array is designed or "focused" towards an X-ray source located at a known distance or a range of distances. The shape of the electrodes shown in FIG. 7B is optimal for distant X-ray sources, i.e., the electrodes are "focussed" at infinity.

Figure 7C:
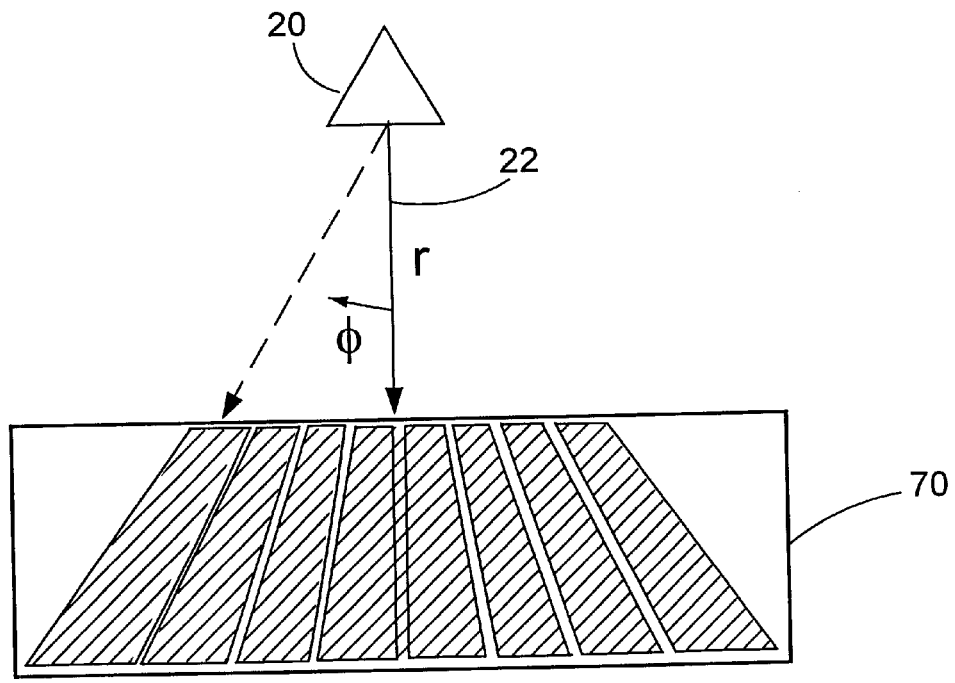
Figure 7D:
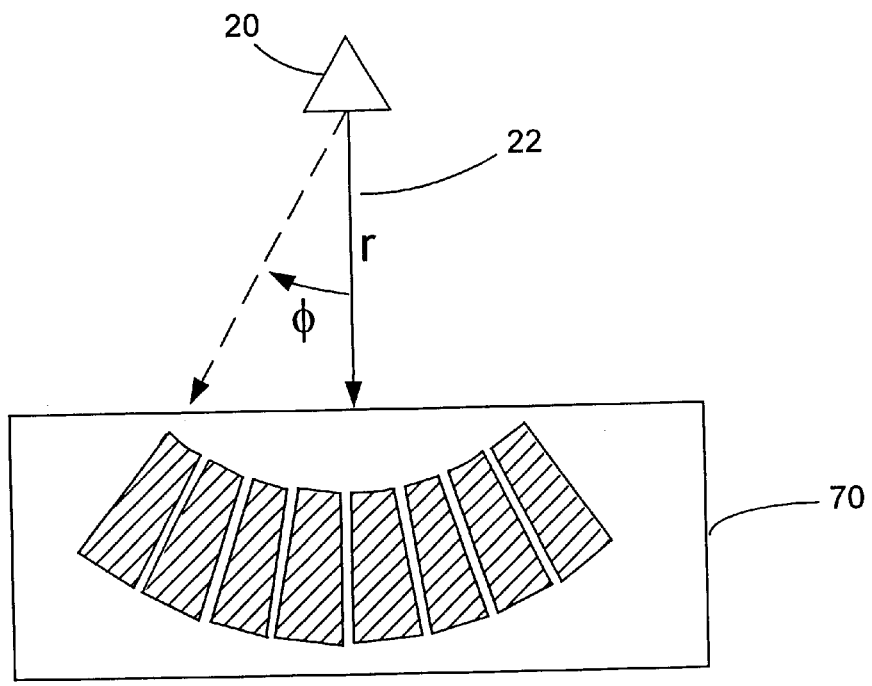

FIG. 7C shows an arrangement of electrodes designed to optimize its ability to convert x-rays into electrical signals using a single electrode. Each electrode spans along the entire absorption path of the detected x-rays inside photoconductive material 74. FIG. 7D shows another form of "focussing," where the side edges are aligned with the x-ray direction and the top and bottom edges of each electrode are arc segments in the (r, p) coordinate system.

The shape of each electrode $78_{ij}$ can be tailored for the specific requirements due to the angulation of the X-ray tube of X-ray source 20. For example, the shape of electrodes $78_{ij}$ can provide the same energy level for the second row directly under the tube or at an off-axis angle.

The topography of the surface of the collecting electrode is somewhat simpler than for TFTs, thus providing a more uniform electric field in the photoconductive material.

According to another embodiment, the electrodes may be fabricated and arranged as described in U.S. Pat. Nos. 5,498,880; 5,827,757; 5,844,243; 5,895,936; 5,969,360; and 6,025,599, which are incorporated by reference. Photoconductive material 74 may be coated over by the charge blocking layer located below each electrode 78. The combination of these layers behaves as a blocking diode that inhibits a charge flow in one direction.

Detector plates 46 and 70 include photoconductive materials 48 and 74, respectively, which may be amorphous selenium, lead oxide, thallium bromide, cadmium telluride, cadmium sulfide, mercuric iodide or other similar materials, as described in U.S. Pat. No. 5,498,880, or may be lead iodide ($PbI_2$) or lead oxide ($PbO_x$) as described in U.S. Pat. No. 5,729,021. Photo-conductive materials 48 and 74 may be organic or inorganic materials as described in U.S. Pat. No. 5,556,716, which is incorporated by reference. To achieve good energy resolution, photoconductive material 48 or 74 provides an X-ray absorption path of at least 1 cm for a known energy range, which in turn enables electrodes having the size of about 1 mm or more. Thus, photoconductive material 48 or 74 may include polymers or a composite of polymers with inorganic photoconductors as described in U.S. Pat. No. 5,556,716. Organic photoconductors usually generate a smaller dark current.

According to another preferred embodiment, detector plate 70 is formed by stacking of several layers over printed circuit board 79. An (optional) adhesive primer layer is initially deposited over printed circuit board 79. Next, a charge blocking layer is deposited to prevent injection of charges from printed circuit board 79 into photoconductive material 74, and thus prevent contribution to the dark current. Preferably, photo-conductive material 74 (or 48) is made of inorganic photoconductors such as an amorphous selenium layer of about 200 μm to several hundred μm. Next, another charge blocking layer is deposited to restrict charge injection from electrode 80 into photoconductive material 74. The last layer is the common electrode 80, which is made of a deposited metal. The charge blocking layers are relatively thin, on the order of a few micrometers to fraction of a micrometer.

The charge blocking layers surrounding photoconductive material 74 are designed depending upon the polarity of the high voltage bias. For example, a blocking layer made of $CeO_2$ may be located between aluminum electrode 80 and photoconductive material 74, which is an amorphous selenium layer, as described in U.S. Pat. No. 5,869,837.

According to another embodiment, as described in EP application EP 0 971 244 A2 (which is incorporated by reference), high-voltage electrode 80 is made of Pd, Au, Al, Mo, Pt and photoconductive material 74 is made of CdTe, PbO, $HgI_2$, CdSe or amorphous Se. For example, detector plate 70 is made of a negatively biased top electrode (i.e., electrode 80), a p-type barrier layer to degrade electron transport and favor hole transport, and photoconductive material 74 made of a doped amorphous Se layer. The amorphous Se layer is covered by n-type barrier layer to degrade hole transport and favor electron transport to electrodes 78.

According to another embodiment, as described in U.S. Pat. No. 5,396,072 (which is incorporated by reference), detector plate 70 includes high-voltage electrode 80 is made of gold or aluminum, a barrier layer of made of amorphous Se doped with As, a layer designed to conduct negative carriers, such as a n-type layer 0.5 μm to 2 μm thick made of amorphous Se doped with 20 to 200 ppm alkali metal (e.g., Li, Ma, K, Cs), and photoconductive material 74 made of a 200 μm to 800 μm layer of amorphous Se doped with 0.1 to 1% As. Deposited on photoconductive layer 74 is a barrier semiconductor layer made of PbO, CdTe, CdSe, $HgI_2$ or 1–5 μm amorphous Se doped with 20 ppm to 200 ppm Cl and designed to conduct positive carriers to electrodes 78. The arrangement is designed to reduce dark current.

Figure 8A:
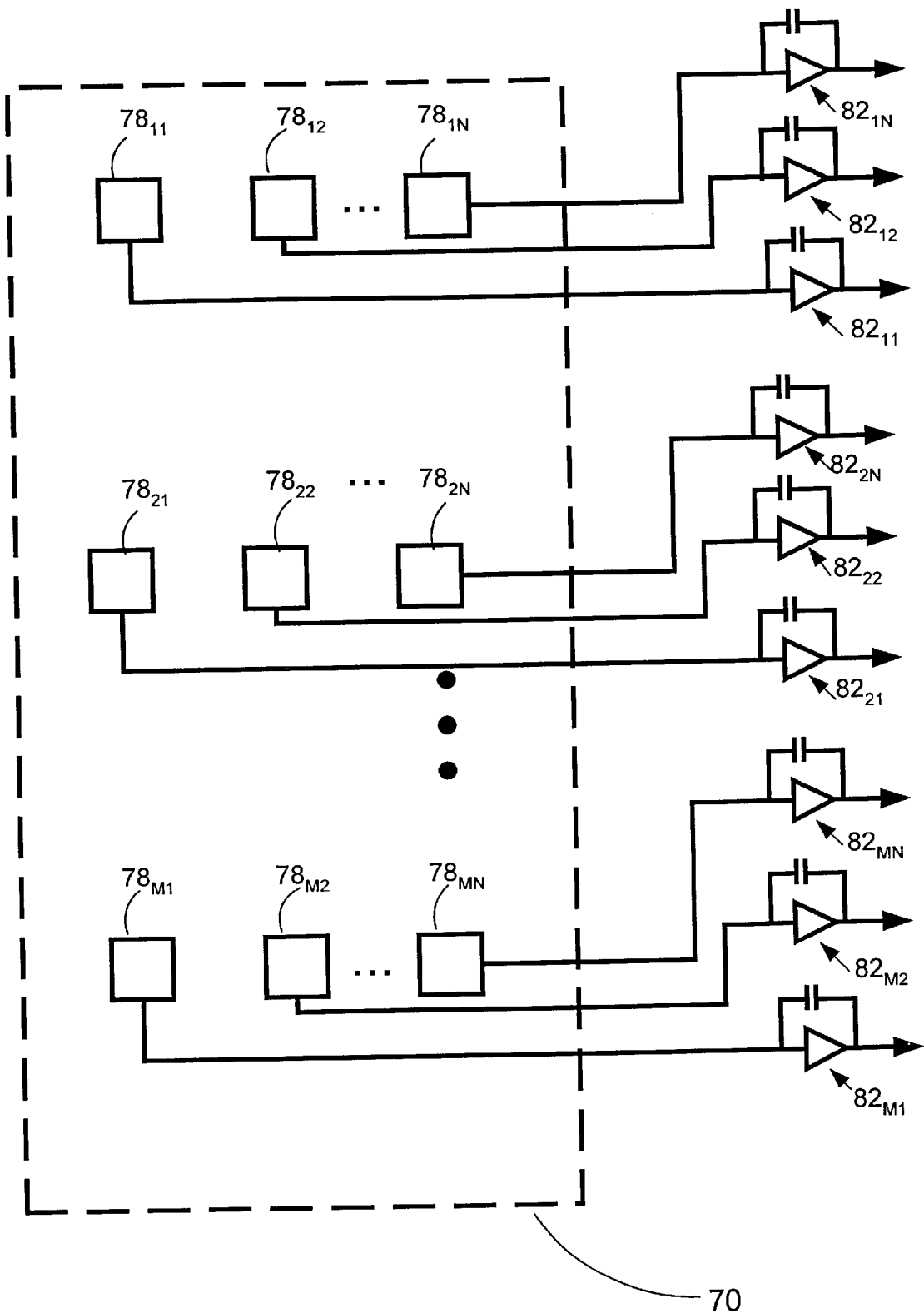
FIGS. 8A, 8B and 8C show various embodiments of a read-out from the detector plates shown in FIGS. 7A–7D.
Figure 8B:
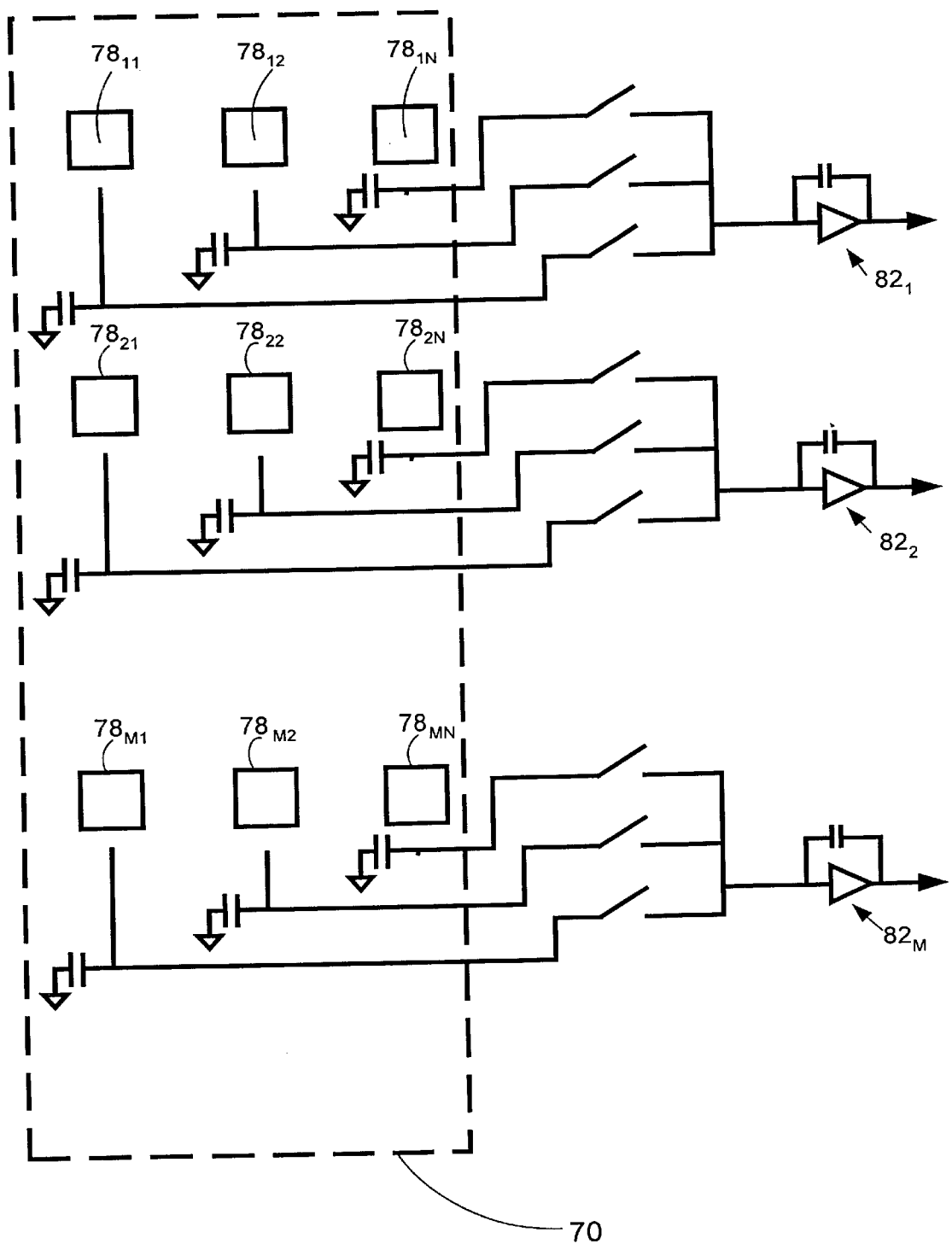
Figure 8C:
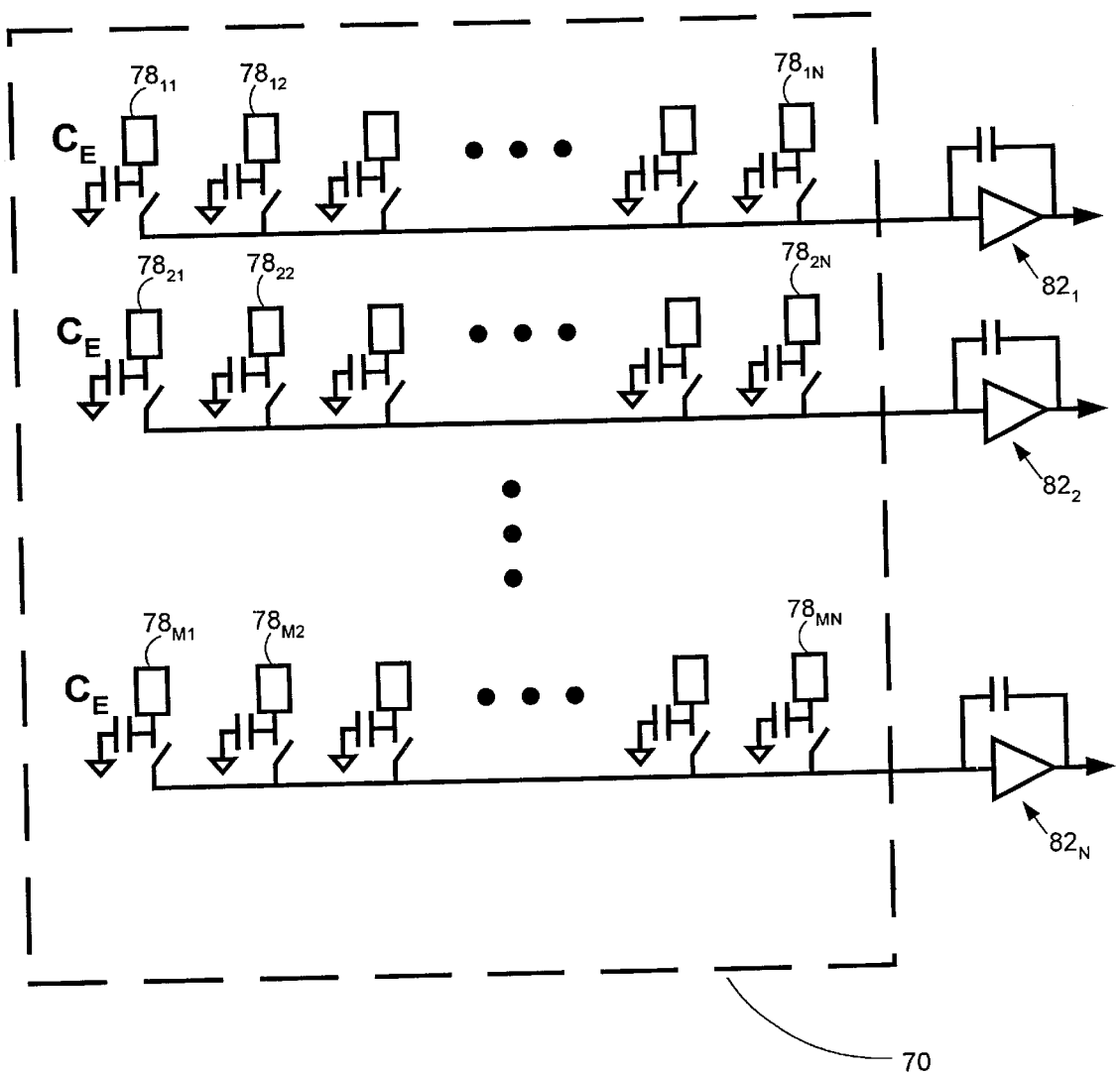

FIGS. 8A, 8B and 8C show various embodiments of a read-out topology from electrodes 78 located on detector plate 70. Referring to FIG. 8A, according to a presently preferred embodiment, each electrode $78_{ij}$ is connected to one charge amplifier $82_{ij}$. Each charge amplifier $82_{ij}$ collects the current generated from the above-described X-rays absorption events. The electric charge accumulated on the associated capacitor is periodically discharged by a reset switch (SWr shown in FIG. 9) activated after an integration period. Printed circuit board 79 includes multiple layers used to provide connections between electrodes $78_{ij}$ and their associated charge amplifiers $82_{ij}$ in a manner that only electrode $78_{ij}$ and the connections are exposed to X-rays being absorbed inside photoconductive material 74. Detector plate 70 may include a multiple layer PCB (with one or several ground planes designed for shielding.

Alternative embodiments are shown in FIGS. 8B and 8C, where each electrode $78_{ij}$ includes a switch preferably located outside the area exposed to the detected X-rays, as shown in FIG. 9B. These embodiments minimize the required number of charge amplifiers to one amplifier for a row of electrodes $78_{ij}$.

Figure 9:
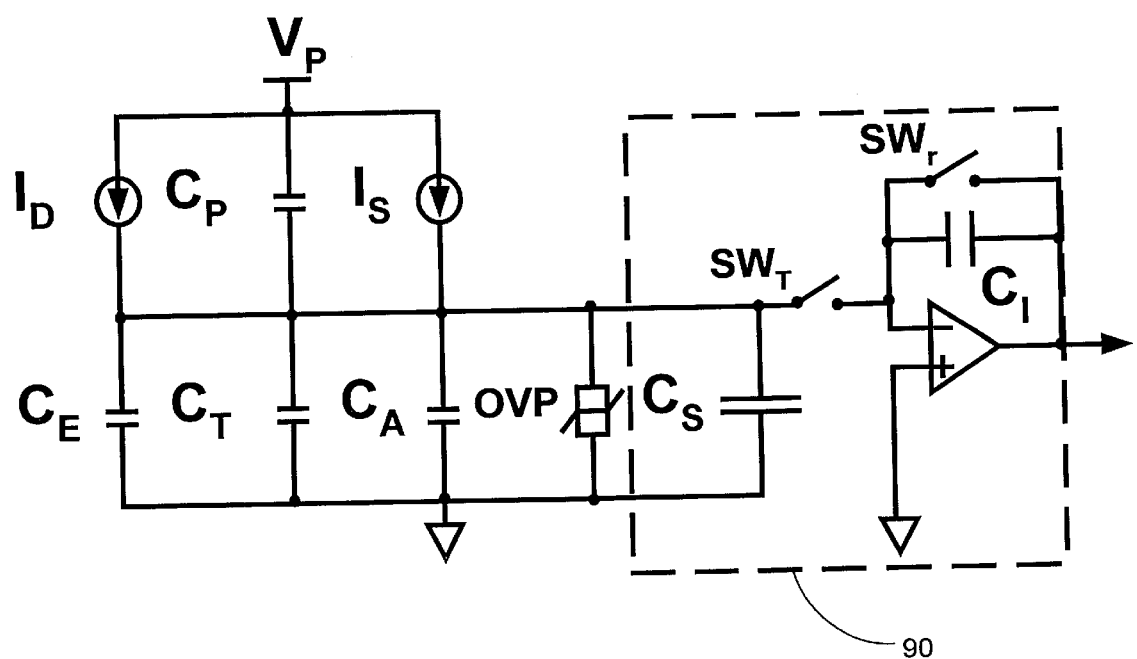
FIG. 9 is a schematic diagram of a circuit for reading out electric signals from electrodes used in FIGS. 7A–7D.

FIG. 9 shows a schematic diagram for processing signal current from each electrode $78_{ij}$, according to the preferred embodiment. The diagram includes a precision-switched integrator transimpedance amplifier IVC 102 available from Burr-Brown (Burr-Brown Company, Tucson, Ariz. 85734) but other amplifiers may also be used. This precision-switched integrator transimpedance amplifier 90 is optimized for low-level signal detection. In the schematic diagram, $I_s$ represents the current generated from X-ray absorption events and ID represents a leakage current that depends on the type of photo-conductive material 74, as described above. $C_E$ represents a collecting electrode capacitance that depends on the electrode's shape and the distance to the ground plane of the PCB, and depends on the type of dielectric. $C_T$ represents a capacitance of the trace from the electrode to the charge amplifier. $C_A$ is an additional capacitor that can be used to increase the dynamic range of the collecting electrode when the transfer switch $SW_T$ is open. $C_S$ represents a stray capacitance of the input of the charge amplifier in IVC 102.

Specifically, a for photoconductive layer of about 500 μm, electrodes 78$_{ij}$ having a size of about 1 mm×1 mm and located on printed circuit board 79 provide the following approximate values: $C_P$=0.01 pF, $C_E$=0.5 pF, $C_T$=2.5 pF, $C_S$=3 pF, $C_A$=22 pF, and $C_I$=30 pF. Printed circuit board 79 may include multiple layers of signals and multiple layers of ground or power planes. This in order to accommodate higher density routing. The interconnections from electrodes 78$_{ij}$ to the charge amplifier usually start by a feedthrough hole in the electrode, and then are routed by a trace in the inner layers or the bottom layer of printed circuit board 79. The feedthrough hole may be filled by a conductive material. The gaps between neighbouring electrodes 78$_{ij}$ may also be filled with a very high resistivity coating.

Figure 10:
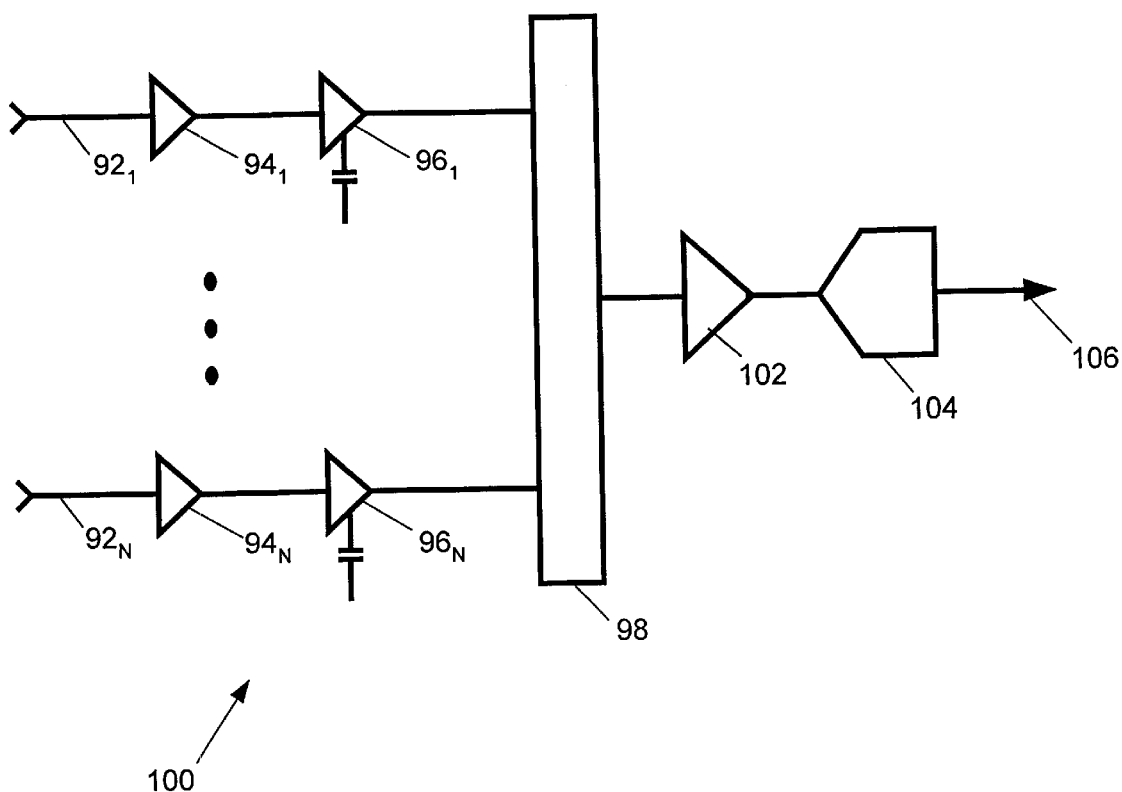
FIG. 10 is a schematic diagram of signal processing after receiving individual amplified signals.

FIG. 10 shows a schematic diagram of a signal processing circuit 100. Signal processing circuit 100 receives the individual amplified signals 92$_1$ through 92$_N$ from charge amplifier 90. Fixed gain amplifiers 94$_1$ through 94$_N$, further amplify signals 92$_1$ through 92$_N$ and provide them to sample-and-hold amplifiers 96$_1$ through 96$_N$, which may be part of IVC 102. The use of those sample-and-hold amplifiers 96$_1$ through 96$_N$ allows various modes of integration in order to accommodate both the collecting electrode and the analog-to-digital converter behaviors. An analog multiplexer 98 receives the amplified signals and allows the sharing of an analog-to-digital converter 104 by a number of electrodes 78$_{ij}$. The width of analog multiplexer 98 depends on packaging constraints and parameters such as the speed of the analog-to-digital converter 104 and the integration time. Signal processing circuit 100 may also include a programmable gain amplifier 102. Programmable gain amplifier 102 can accommodate different X-ray exposure doses and integration time values. This design depends on a specific application.

The X-ray detection system of FIG. 4 may include a number of a signal processing circuits 100. For example, a 256-electrode detector plate 70 may include 8 blocks of 32 electrodes 78$_{ij}$. Each block is connected to one signal processing circuit 100. Each analog-to-digital converter 104 transforms the analog signals to digital signals for further digital signal processing in a system shown in FIG. 11. Typical analog-to-digital converter has a resolution of 14 bits although a smaller resolution is acceptable at the expense of increasing the sampling noise.

Figure 11:
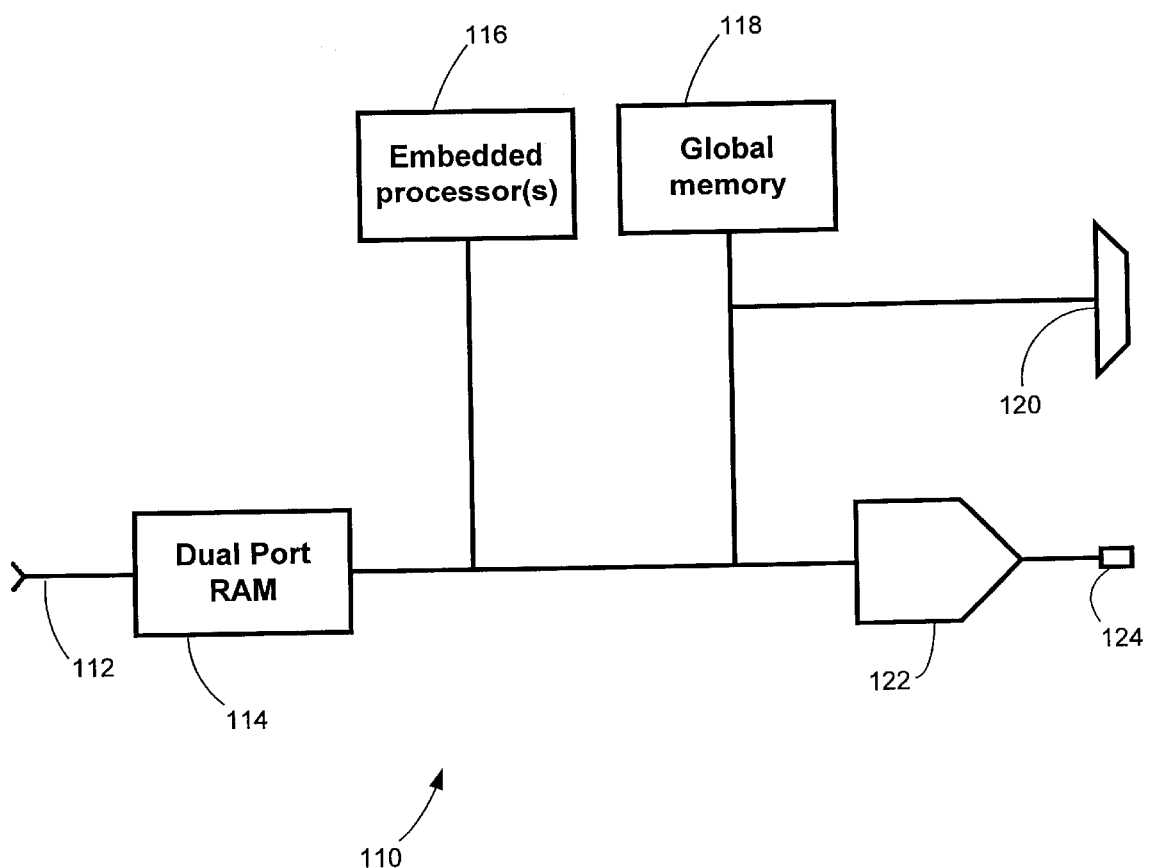
FIG. 11 shows diagrammatically a digital signal processing architecture of the X-ray detection system of FIG. 4.

Referring to FIG. 11, a digital signal processing system 110, includes dual ports RAM 114, a set of embedded processors 116, a global memory 118, a digital output port 120, and an analog output port 124 receiving data from a digital-to-analog converter 122.

Referring to FIGS. 4 and 5, preferably the entire X-ray system 12 is mounted together a C-arm in a way that vibrations of X-ray source 20 relative to X-ray detector 60 is minimized. X-ray source 20 is located symmetrically relative to the plane of symmetry of detector plate 70; this is the most important alignment requirement. X-ray window 64 is aligned with X-ray sensitive surface 76. An examined object crosses this plane when it passes between X-ray source 20 and X-ray detector 60 as it moves substantially perpendicularly to this plane. Alternatively, X-ray system 12 has X-ray source 20 and detector 60 moving relatively to each other. For instance, a translation of X-ray detector 60 along a perpendicular axis relatively to X-ray source 20 requires to correlate the translation movement to a progressive change of the angle of detector plate 70.

During a calibration procedure, X-ray source 20 is turned on continuously at very small power, which varies greatly according to the industrial or medical application. For example, the power is about 10 μA @ 50 kV for a small industrial source. The detector integration time (typically down to 500 usec) is adjusted so that the pixel value stands on the surroundings of half the saturation digital value. Added aluminum filtration (100 μm to 25 mm) may be added directly over detector housing 62 to bring down the intensity level read by X-ray detector 60.

The detector samples are continuously converted to digital values and pixel values are displayed continuously on a host computer connected to digital output port 120. Digital averaging is used to stabilize the displayed sampled values. The angle of the plane of symmetry of detector plate 70 can be adjusted using a lateral mounting screw associated with detector housing 62. A maximum readout value of the center pixel is found by manually adjusting the lateral mounting screw or using a precision motorized axis that is arranged for an automated adjustment procedure.

Figure 12:
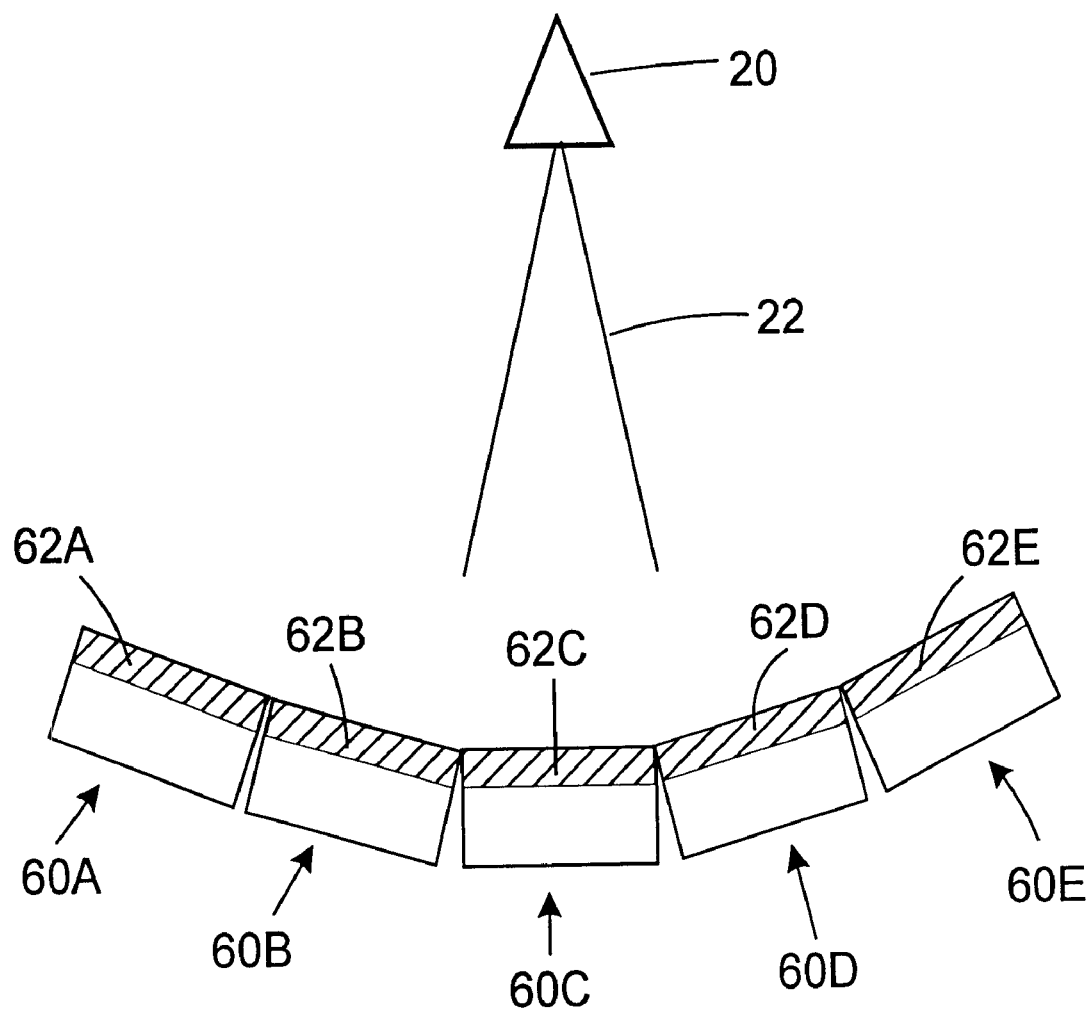
FIGS. 12 and 12A show schematically two X-ray detection systems used for computed tomography.
Figure 12A:
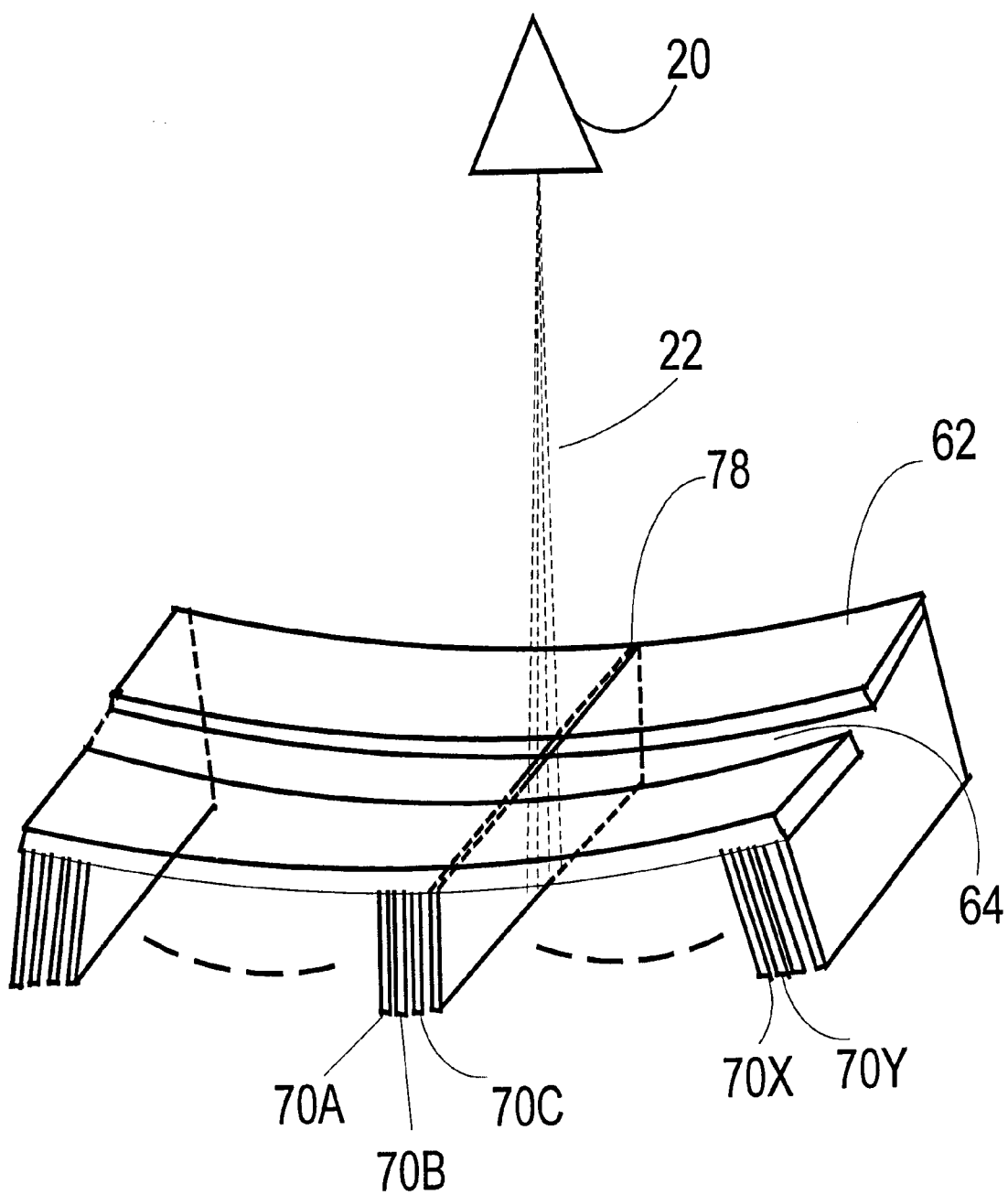

FIGS. 12 and 12A show schematically two X-ray detection systems used for computed tomography. FIG. 12 shows in a side view of multiple blocks of X-ray detection systems 60A, 60B, 60C, 60D, and 60E. FIG. 12A shows a different arrangement of X-ray detection systems 60A, 60B, 60C, 60D, and 60E having a different orientation of the detector plates than the arrangement shown in FIG. 12. The arrangement of FIG. 12A is particularly suited for a wide angle CT applications like multiple slices CTs or cone beam reconstruction CTs. Housing 62 shields the read-out electronics located on each board. X-ray window 64 is up to 200 mm wide and is aligned with edges 76 of photoconductive materials 74. Additional shields (such as shields 65 and 66 shows in FIG. 6) may be used to protect the read-out electronics.

According to another embodiment, X-ray detection system 60 is constructed to indirect detection of X-rays by first converting them to secondary optical radiation in a scintillating layer and then detecting the secondary optical radiation in the photoconductive material. The scintillating layer is located above the edge of the photoconductive material so that impinging X-rays are converted to photons in the visible range. The optical radiation is absorbed in the top layers below the edge of the photoconductive material and converted to electrical signals.

Some high-energy photons of the detected X-ray radiation may be transmitted through the scintillating layer deeper into the photoconductive material. These high-energy X-ray photons are converted to electrical signals as described above.

There is a wide range of industrial and medical applications for X-ray detection system 30, shown in FIG. 1, or X-ray detection system 60, shown in FIG. 4. X-ray detection systems 30 and 60 may be used in dual-energy or multiple-energy digital radiography. For example, detection system 30 or 60 can replace a detector assembly used in a scan projection radiography system described in U.S. Pat. No. 4,789,930, which is incorporated by reference.

According to another embodiment, X-ray detection system 30 or 60 may be used in a dual-energy or multiple-energy bone densitometry apparatus as described in U.S. Pat. Nos. 4,811,373; 5,150,394; or 5,949,846, all of which are incorporated by reference.

According to yet another embodiment, X-ray detection system 30 or 60 may be used in a dual energy or a multiple energy X-ray or gamma-ray inspection systems such as described in U.S. Pat. Nos. 5,420,905; 5,490,218; or 5,841,832, all of which are incorporated by reference. The system may include an X-ray source and a single or several detector plates oriented towards the object and perpendicular to object movement. In this embodiment, the detector is not directly facing the source, as in FIGS. 1 and 4, and detect scattered X-ray rather than transmitted X-ray.

According to yet another embodiment, X-ray detection systems 30 or 60 may be used in material inspections systems that detect transmitted or scattered X-rays. These systems employ dual-energy or multiple-energy X-rays for characterizing the quality of an examined material (e.g., inspecting a material for various flaws) or for characterizing the quality of a process (e.g., a bond or weld). Alternatively, X-ray detection system 30 or 60 may be used to inspect different physical objects, such as foodstuff, moving on a conveyor. Such system can perform a quality control or can detect the presence of "foreign" material in foodstuff (such as glass, pieces of metal or other material). Alternatively, X-ray detection system 30 or 60 can be used to detect the presence of selected minerals, such as diamonds in the presence of a slurry or a mixture of rocks and other materials. The obtained data can be displayed on a computer device, such as a color monitor or an LCD display.

Having thus described the invention and various illustrative embodiments and uses as well as some of its advantages and optional features, it will be apparent that such embodiments are presented by way of example only and not by way of limitation. Those persons skilled in the art will readily derive further modifications developments and enhancements to and improvements on these embodiments, as well as additional embodiments, without departing from the spirit and scope of the invention. It is impossible to enumerate all of the variations that will quite quickly occur to those in the art. Accordingly, the invention is limited only as defined in the following claims and equivalents thereto.

What is claim is:

1. An X-ray detection system for detection incoming X-rays, each X-ray being characterized by an energy, said system comprising:
   a body of photoconductive material;
   at least two electrodes constructed and coopertively arranged at said body to provide an electric field inside said body in a first direction;
   an X-ray shield and an X-ray window constructed and a ranged to direct the incoming X-rays into said body in a selected X-ray direction substantially different from said first direction, the directed X-rays being absorbed inside said body at different absorption locations, during absorption the X-rays being converted into electric charges;
   dielectric material overlaying at least in part said body and at least one of said electrodes, said dielectric material located between said body and said X-ray shield; and
   a read-out circuitry capable to detect said electric charges.

2. The X-ray detection system of claim 1 wherein said read-out circuitry is responsive to said electric charges for generating electric signals indicative of the absorption locations of the X-rays, said X-ray detection system further including a processing circuitry constructed and arranged to determine the energy of the absorbed X-rays based on the electric signals generated by said read-out circuitry.

3. The X-ray detection system of claim 2 wherein at least one of said electrodes belongs to electron optics constructed and arranged to deflect an electron beam over a surface of said body.

4. The X-ray detection system of claim 3 wherein said electron optics co-operatively operates with said read-out circuitry to register the depth of said absorption locations within said body when generating said electric signals.

5. The X-ray detection system of claim 3 wherein said read-out circuitry is arranged to integrate said electric charges over time.

6. The X-ray detection system of claim 2 wherein said electrodes are arranged to apply a voltage directly to said body of photoconductive material to create said electric field inside said body in said first direction.

7. The X-ray detection system of claim 2 wherein said at least two electrodes include a first high-voltage electrode disposed on a first side of said body and an array of electrodes distributed over a second side of said body.

8. The X-ray detection system of claim 7 wherein said read-out circuitry is connectable to each said electrode of said array.

9. The X-ray detection system of claim 7 wherein said read-out circuitry is connectable to each said electrode of said array and is arranged to integrate said electric charges over time.

10. The X-ray detection system of claim 2 wherein said body of photoconductive material is a film of a selected thickness.

11. The X-ray detection system of claim 2 wherein said body of photoconductive material is a film of a selected thickness, wherein said electrodes are arranged to apply a voltage directly to said body across said thickness to create said electric field inside said body in said first direction, and wherein said X-ray shield and said X-ray window are arranged to direct said X-rays to an edge of said film.

12. The X-ray detection system of claim 11 wherein said X-ray shield and said X-ray window are arranged to direct said X-rays to said edge having said X-ray direction being substantially perpendicular to said first direction.

13. The X-ray detection system of claim 1 wherein said X-ray shield and said X-ray window are arranged to direct said X-rays into said body having said selected X-ray direction oriented at an angle of about 45° to 90° relative to said first direction.

14. An X-ray system comprising:
   an X-ray source constructed and arranged to emit X-rays having at least two energies; and
   an X-ray detection system for receiving X-rays emitted by said X-ray source, said X-ray detection system including:
      a body of photoconductive material;
      at least two electrodes constructed and cooperatively arranged at said body to provide an electric field inside said body in a first direction;
      an X-ray shield and an X-ray window constructed and arranged to direct X-rays into said body in a selected X-ray direction substantially different from said first direction, the directed X-rays being absorbed inside said body at different absorption locations, during absorption the X-ray being converted into electric charges;
      dielectric material overlaying at least in part said body and at least one of said electrodes, said dielectric material located between said body and said X-ray shield;

a read-out circuitry capable to detect said electric charges, said read-out circuitry being responsive to said electric charges for generating electric signals indicative of the absorption locations of the X-rays; and a processing circuitry constructed and arranged to determine the energy of the absorbed X-rays based on the electric signals generated by said read-out circuitry.

15. A method of detecting X-ray radiation, said method comprising:

providing a body of photoconductive material cooperatively arranged with at least two electrodes;

providing an electric field inside said body in a first direction;

overlaying at least in part said body and at least one of said electrodes with dielectric material;

shielding X-ray radiation for directing X-rays into said body in a selected X-ray direction substantially differnt from said first direction, the directed X-rays being absorbed inside said body at different absorption locations, during absorption the X-rays being converted into electric charges;

detecting the electric charges inside said body; and generating electric signals in response to the detection of the electric charges, the electric signals being indicative of the absorptions on locations of the X-rays.

16. The method of claim 15 further including determining the energy of the absorbed X-rays on the basis of their absorption locations.

17. The method of claim 16 wherein at least one of said electrodes is part of electron optics arranged to deflect an electron beam, said providing an electric field including the step of applying said electron beam to a surface of said body.

18. The method of claim 17 wherein said generating electric signals includes integrating said electric charges over time.

19. The method of claim 16 wherein said electrodes apply a voltage directly to said body to create said electric field inside said body in said first direction.

20. The method of claim 19 wherein said detecting electric charges includes the step of providing several electrodes distributed at said body.

21. The method of claim 20 wherein said generating electric signals includes integrating said electric charges over time.

22. The X-ray detection system of claim 7 wherein said dielectric material overlays at least in part said first high-voltage electrode, said dielectric material being located between said first high-voltage electrode and said X-ray shield.

23. The X-ray detection system of claim 22, wherein said dielectric material is operative to prevent the occurrence of high voltage breakdown within said X-ray detection system.

24. The method of claim 15 further including calibrating an orientation of said body of photoconductive material for optimizing electric charge production within said body.

25. The method of claim 24 wherein said calibrating includes providing an X-ray absorbing material to reduce an intensity of the X-ray radiation.

26. The method of claim 25 wherein the X-ray absorbing material is aluminum.

27. The X-ray detection system of claim 22 wherein said dielectric material is Parylene.

* * * * *